(12) United States Patent
Okamura et al.

(10) Patent No.: US 11,766,695 B2
(45) Date of Patent: Sep. 26, 2023

(54) GAS BARRIER LAMINATE AND PACKAGING MATERIAL INCLUDING THE SAME

(71) Applicant: TOPPAN PRINTING CO., LTD., Tokyo (JP)

(72) Inventors: Kengo Okamura, Tokyo (JP); Miki Fukugami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 105 days.

(21) Appl. No.: 16/922,140

(22) Filed: Jul. 7, 2020

(65) Prior Publication Data
US 2020/0331024 A1    Oct. 22, 2020

Related U.S. Application Data

(63) Continuation of application No. PCT/JP2019/001539, filed on Jan. 18, 2019.

(30) Foreign Application Priority Data

Jan. 19, 2018  (JP) .................. 2018-007295
Jun. 25, 2018  (JP) .................. 2018-119837
(Continued)

(51) Int. Cl.
*B05D 1/02*     (2006.01)
*C23C 16/40*    (2006.01)
(Continued)

(52) U.S. Cl.
CPC .................. *B05D 1/02* (2013.01); *B05D 7/02* (2013.01); *B05D 7/52* (2013.01); *C08J 7/043* (2020.01);
(Continued)

(58) Field of Classification Search
CPC .. B32B 1/02; B32B 1/08; B32B 27/18; B32B 27/20; B32B 27/26; B32B 27/28;
(Continued)

(56) References Cited

U.S. PATENT DOCUMENTS

2005/0131162 A1* 6/2005 Tanaka ................... B32B 27/08
                                                        525/329.7
2007/0111005 A1  5/2007 Oshita et al.
(Continued)

FOREIGN PATENT DOCUMENTS

EP    3 006 369 A1    4/2016
EP    3 061 606 A1    8/2016
(Continued)

OTHER PUBLICATIONS

Kuwagata—JP 2014-069389 A—MT—gas barrier laminate—anchor coat+vapor deposit. +substrate—2014 (Year: 2014).*
(Continued)

*Primary Examiner* — John Vincent Lawler
(74) *Attorney, Agent, or Firm* — Foley & Lardner LLP

(57) ABSTRACT

A gas barrier laminate including a resin substrate, a first coating layer containing a carboxylic acid polymer; and a second coating layer containing a polyvalent metal compound and a resin, laminated in this order; a ratio of a thickness of the second coating layer to the first coating layer in the range of 1.0 or more and 4.0 or less; and the second coating layer satisfies at least one of the following: (condition 1) a haze of the second coating layer is 8% or less; (condition 2) a surface roughness Ra of the second coating layer is ½ or less of the thickness of the second coating layer; and (condition 3) the number of concave portions having a diameter of 1.5 μm or more per unit area on a surface of the second coating layer opposite to the first coating layer is 2/0.01 mm² or less.

7 Claims, 13 Drawing Sheets

(30) Foreign Application Priority Data

Jan. 17, 2019 (JP) ................................ 2019-005916
Jan. 17, 2019 (JP) ................................ 2019-006093
Jan. 17, 2019 (JP) ................................ 2019-006095

(51) Int. Cl.

| | |
|---|---|
| *C23C 16/02* | (2006.01) |
| *C23C 28/00* | (2006.01) |
| *B05D 7/00* | (2006.01) |
| *B05D 7/02* | (2006.01) |
| *C08J 7/04* | (2020.01) |
| *C08J 7/043* | (2020.01) |
| *C08J 7/048* | (2020.01) |
| *C23C 14/08* | (2006.01) |

(52) U.S. Cl.
CPC ............ *C08J 7/048* (2020.01); *C08J 7/0423* (2020.01); *C23C 14/081* (2013.01); *C23C 16/0272* (2013.01); *C23C 16/403* (2013.01); *C23C 28/00* (2013.01); *B05D 2201/04* (2013.01); *B05D 2502/00* (2013.01); *B05D 2503/00* (2013.01); *B05D 2518/12* (2013.01); *C08J 2433/02* (2013.01); *C08J 2475/08* (2013.01)

(58) Field of Classification Search
CPC ...... B32B 27/30; B32B 27/308; C08J 7/0423; C08J 7/043; C08J 7/048; C08J 2433/02; C08J 2475/08; C23C 14/081; C23C 16/0272; C23C 16/403
See application file for complete search history.

(56) References Cited

U.S. PATENT DOCUMENTS

| | | | | |
|---|---|---|---|---|
| 2011/0217561 | A1* | 9/2011 | Fujimura | .............. B32B 27/308 428/480 |
| 2012/0148785 | A1* | 6/2012 | Hsu | ......................... B32B 27/32 428/335 |
| 2016/0075910 | A1 | 3/2016 | Omori et al. | |
| 2016/0229605 | A1 | 8/2016 | Omori et al. | |
| 2018/0230319 | A1* | 8/2018 | Matsui | ................ C09D 167/00 |

FOREIGN PATENT DOCUMENTS

| | | | | |
|---|---|---|---|---|
| JP | H295436 | A | 4/1990 | |
| JP | 2007-245433 | A | 9/2002 | |
| JP | 2005-075360 | A | 3/2005 | |
| JP | 2008-254765 | A | 10/2008 | |
| JP | 4365826 | B2 | 11/2009 | |
| JP | 2013-006340 | A | 1/2013 | |
| JP | 2014-065155 | A1 | 4/2014 | |
| JP | 2014/069389 | * | 4/2014 | .............. B32B 9/00 |
| JP | 2015/006757 | * | 1/2015 | ............. B32B 27/00 |
| WO | WO-2013/118442 | A | 8/2013 | |
| WO | WO-2017/069143 | A1 | 4/2017 | |
| WO | WO 2017/170252 | * | 10/2017 | .............. B32B 7/02 |

OTHER PUBLICATIONS

Ishii—JP 2015-006757 A—MT—gas barrier laminate—inorganic+3 barrier layers—2015 (Year: 2015).*

Suzuki—WO 2017-170252 A1—MT—gas barrier laminate w-roughness—2017 (Year: 2017).*

International Searching Authority, "International Search Report," issued in connection with International Patent Application No. PCT/JP2019/001539, dated Mar. 5, 2019.

International Searching Authority, "Written Opinion," issued in connection with International Patent Application No. PCT/JP2019/001539, dated Mar. 5, 2019.

Extended European Search Report dated Feb. 11, 2021 for corresponding European Patent Application No. 19741638.1.

Office Action issued in corresponding JP Patent Application No. 2018-119837 dated Apr. 19, 2022 (8 pages).

Office Action issued in corresponding Japanese Patent Application No. 2019-005916, dated Jul. 19, 2020.

* cited by examiner

GAS BARRIER LAMINATE AND PACKAGING MATERIAL INCLUDING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/001539, filed on Jan. 18, 2019, which is based upon and claims the benefit of priority to Japanese Patent Applications Nos. 2018-007295, filed on Jan. 19, 2018; 2018-119837, filed Jun. 25, 2018; 2019-005916, 2019-006093, and 2019-006095, all filed on Jan. 17, 2019, the disclosures of which are all incorporated herein by reference in their entireties.

BACKGROUND

Technical Field

The present disclosure relates to a gas barrier laminate and a packaging material including the gas barrier laminate.

Background Art

In many fields such as food products, beverages, pharmaceutical products, and chemical products, packaging materials have been developed according to the contents of the packaging materials. Such packaging materials are required to have a function of preventing degradation of the contents. In order to allow the packaging materials to have the function of preventing degradation of the contents, for example, the packaging materials are provided with properties for preventing permeation of oxygen, water vapor, and the like (gas barrier properties). PTL 1 discloses a gas barrier laminate including a layer containing a neutralized product of a polymer in which at least part of a —COO— group contained in a functional group is neutralized with metal ions having a valence of two or more (polyvalent metal ions). Such a gas barrier laminate is used, for example, for packaging materials for pressure-heat sterilization treatment (retort treatment). Thus, even after a packaging material is subjected to retort treatment, oxygen barrier properties of the packaging material are to be ensured. The oxygen barrier properties are properties for preventing permeation of oxygen.

[Citation List] [Patent Literature] [PTL 1] JP 4365826 B2

SUMMARY OF THE INVENTION

Technical Problem

When the contents of a product subjected to retort treatment contains sulfur, sulfur-derived compounds may be generated, causing an unpleasant odor (retort odor) to be generated in the packaging material. Thus, the compound that causes the retort odor may be able to be absorbed by the gas barrier laminate. However, when the compound is absorbed by the gas barrier laminate, the oxygen barrier properties tend to be deteriorated.

An object of an aspect of the present disclosure is to provide a gas barrier laminate capable of better achieving both oxygen barrier properties and prevention of retort odor, and a packaging material including the gas barrier laminate.

Solution to Problem

A first aspect of the present disclosure provides a gas barrier laminate configured as follows. The gas barrier laminate according to the first aspect of the present disclosure includes: a resin substrate; a first coating layer containing a carboxylic acid polymer; and a second coating layer containing a polyvalent metal compound and a resin, wherein: the resin substrate, the first coating layer, and the second coating layer are laminated in this order; a ratio of a thickness of the second coating layer to a thickness of the first coating layer is in the range of 1.0 or more and 4.0 or less; and the second coating layer satisfies at least one of the following conditions 1 to 3:

(condition 1) a haze of the second coating layer is 8% or less;

(condition 2) a surface roughness Ra of the second coating layer is ½ or less of the thickness of the second coating layer; and (condition 3) the number of concave portions having a diameter of 1.5 μm or more per unit area on a surface of the second coating layer opposite to the first coating layer is 2/0.01 mm$^2$ or less.

The gas barrier laminate includes the second coating layer containing a polyvalent metal compound. When a packaging material including the gas barrier laminate is subjected to heat treatment such as retort treatment or boiling treatment, hydrogen sulfide generated from the sulfur-containing contents chemically reacts with the polyvalent metal compound of the second coating layer. Thus, the hydrogen sulfide is captured by the gas barrier laminate, leading to improved prevention of retort odor.

Polyvalent metal ions generated from the polyvalent metal compound in the second coating layer also react with the carboxylic acid polymer in the first coating layer by the heat treatment, thereby forming a crosslinked structure in which the carboxylic acid polymers are ionically crosslinked with each other via the polyvalent metal ions. Thus, oxygen barrier properties of the first coating layer are improved, and the first coating layer allows the gas barrier laminate to exhibit good oxygen barrier properties.

If the hydrogen sulfide generated from the contents by the heat treatment reaches the first coating layer, the polyvalent metal ions constituting the crosslinked structure of the first coating layer react with the hydrogen sulfide and destroy the crosslinked structure, leading to deterioration of the oxygen barrier properties of the gas barrier laminate. However, when the ratio of the thickness of the second coating layer to the thickness of the first coating layer is in the range of 1.0 or more and 4.0 or less and the second coating layer satisfies at least one of the conditions 1 to 3, most of the hydrogen sulfide that has entered the gas barrier laminate is captured by the second coating layer and more successfully prevented from reaching the first coating layer. Thus, even when hydrogen sulfide is generated from the sulfur-containing contents, the crosslinked structure in the first coating layer is sufficiently maintained, and the gas barrier laminate can exhibit good oxygen barrier properties.

The thickness of the second coating layer is, for example, in the range of 0.10 μm or more and 0.50 μm or less. In this case, the second coating layer can contain a sufficient amount of polyvalent metal compound. Furthermore, a reduction in flexibility of the second coating layer can be more successfully prevented.

The polyvalent metal compound may be zinc oxide, and a content of the zinc oxide may be in the range of 65 mass % or more and 85 mass % or less relative to a mass of the second coating layer. In this case, it is possible to provide a gas barrier laminate that has light transmissivity and can achieve both oxygen barrier properties and prevention of retort odor at a higher level.

The gas barrier laminate may further include an inorganic vapor deposition layer that contains an inorganic oxide and is provided between the resin substrate and the first coating layer. In this case, due to a synergetic effect of the first coating layer and the inorganic vapor deposition layer, the oxygen barrier properties of the gas barrier laminate can be further improved. The gas barrier laminate may further include a primer layer that contains a urethane compound and is provided between the resin substrate and the inorganic vapor deposition layer. In this case, separation of the resin substrate and the inorganic vapor deposition layer can be further prevented. In the gas barrier laminate, the first coating layer is preferably in direct contact with the second coating layer. In this case, a reaction between the polyvalent metal ions generated from the polyvalent metal compound in the second coating layer and the carboxylic acid polymer in the first coating layer is more likely to proceed, thereby efficiently forming a crosslinked structure of the carboxylic acid polymers via the polyvalent metal ions.

The gas barrier laminate may be for use as a packaging material to be subjected to retort treatment or boiling treatment. According to the gas barrier laminate, it is possible to form a packaging material capable of achieving both oxygen barrier properties and prevention of retort odor at a higher level even when subjected to retort treatment or boiling treatment.

A second aspect of the present disclosure provides a gas barrier laminate configured as follows. The gas barrier laminate according to the second aspect of the present disclosure includes: a film substrate (corresponding to the "resin substrate" of the first aspect) formed of a plastic material; and a coating layer provided on the film substrate, wherein: the coating layer includes a first coating layer and a second coating layer; the first coating layer contains a polycarboxylic acid polymer and at least one silicon-containing compound selected from the group consisting of a silane coupling agent expressed by a general formula $R^1Si(OR^2)_3$, a hydrolysate of the silane coupling agent, and condensates of the silane coupling agent and the hydrolysate; the second coating layer contains a polyvalent metal compound having an ultraviolet absorbance in the range of 0.3 or more and 0.7 or less, the ultraviolet absorbance being a value obtained by subtracting an absorbance at a wavelength of 500 nm from an absorbance at a wavelength of 350 nm measured by absorptiometry; and in the first coating layer, a ratio of a mass of the polycarboxylic acid polymer to a mass of the silicon-containing compound is in the range of 99.5/0.5 to 80.0/20.0.

(The mass of the silicon-containing compound is expressed in terms of the silane coupling agent; and in the general formula, $R^1$ is an organic group containing a glycidyloxy group or an amino group, $R^2$ is an alkyl group, and the three R2 are equal to or different from each other.)

The gas barrier laminate according to the second aspect may further include: an adhesive layer (corresponding to the "primer layer" of the first aspect); and an inorganic vapor deposition layer formed of an inorganic oxide, and the adhesive layer and the inorganic vapor deposition layer may be provided between the film substrate and the coating layer. In this case, due to a synergetic effect of the first coating layer and the inorganic vapor deposition layer, the oxygen barrier properties of the gas barrier laminate can be further improved, and separation of the film substrate and the inorganic vapor deposition layer can be further prevented. The gas barrier laminate according to the second aspect may further include: a modification treatment layer provided on the film substrate; and an inorganic vapor deposition layer that is formed of an inorganic oxide and provided on the modification treatment layer, and the coating layer may be provided on the inorganic vapor deposition layer. The modification treatment layer provided between the film substrate and the inorganic vapor deposition layer can further prevent separation of the film substrate and the inorganic vapor deposition layer.

A third aspect of the present disclosure is a packaging material including the gas barrier laminate. When such a packaging material is filled with the contents and subjected to heat treatment, hydrogen sulfide generated from the contents is absorbed by the gas barrier laminate. Thus, retort odor can be further prevented. In addition, the gas barrier laminate can prevent deterioration of the oxygen barrier properties by the heat treatment, and thus allows the packaging material to exhibit good oxygen barrier properties.

Advantageous Effects of the Invention

An aspect of the present disclosure can provide a gas barrier laminate capable of better achieving both oxygen barrier properties and prevention of retort odor, and a packaging material including the gas barrier laminate.

DETAILED DESCRIPTION

Figure 1:
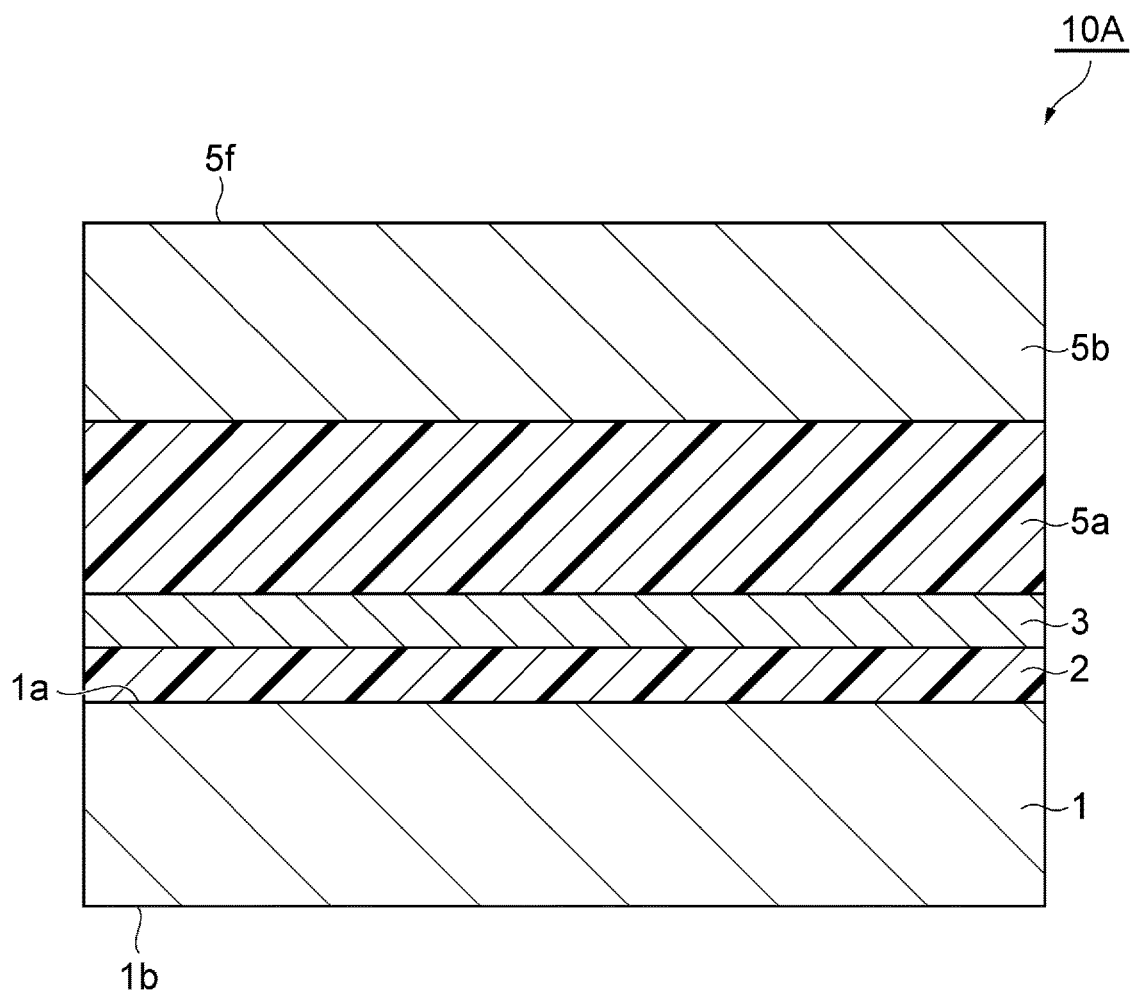
FIG. 1 is a schematic cross-sectional view showing a first embodiment of a gas barrier laminate according to the present disclosure.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

First Embodiment

<Gas Barrier Laminate>

FIG. 1 is a schematic cross-sectional view of a gas barrier laminate according to a first embodiment. A gas barrier laminate 10A shown in FIG. 1 is a film that has at least gas barrier properties against oxygen, water vapor, and the like. Furthermore, the gas barrier laminate 10A has, for example, at least one of flexibility, light transmissivity, and the like.

The gas barrier laminate 10A is a film that has heat resistance and can be for use as a packaging material to be subjected to pressure-heat sterilization treatment (retort treatment) or boiling treatment. The gas barrier laminate 10A may have properties (e.g., light shielding properties, water resistance, temperature and humidity resistance, mechanical strength, ease of printing, ease of decoration, and the like) required in addition to the gas barrier properties and the heat resistance. The retort treatment is, for example, moist-heat sterilization treatment specified in the Food Sanitation Law, and is performed at 100° C. or more. The boiling treatment is sterilization treatment in which an object is warmed in hot water, and is performed at less than 100° C.

The gas barrier laminate 10A includes a resin substrate 1, a primer layer 2 (anchor coating), an inorganic vapor deposition layer 3, a first coating layer 5a (main coating), and a second coating layer 5b (top coating), and has a laminated structure in which the resin substrate 1, the primer layer 2, the inorganic vapor deposition layer 3, the first coating layer 5a, and the second coating layer 5b are arranged in this order.

The resin substrate 1 is a resin film (plastic film) serving as a support. The resin substrate 1 is, for example, a film containing at least one of a polyolefin polymer and an acid-modified product thereof; a polyester polymer; a polyamide polymer; a polyether polymer; a halogen polymer; an acrylic polymer; a polyimide polymer; and an epoxy polymer. Thus, the resin substrate 1 may be a copolymer of monomers constituting the above polymer. The resin substrate 1 may contain, for example, a natural polymer compound such as cellulose acetate. The resin substrate 1 may be a stretched film or a non-stretched film. The resin substrate 1 may have a thickness, for example, in the range of 5 μm or more and 10 mm or less, in the range of 5 μm or more and 800 μm or less, or in the range of 5 μm or more and 500 μm or less.

The resin substrate 1 has a first surface 1a that is in contact with the primer layer 2, and a second surface 1b that is located on a side opposite to the first surface 1a in the thickness direction. From the viewpoint of adhesion to the primer layer 2, the first surface 1a may be subjected to surface treatment. The surface treatment 1b, for example, corona treatment, flame treatment, plasma treatment, or the like. On the second surface 1b, for example, a barrier layer such as a barrier film, an inorganic vapor deposition film, or a metal foil may be provided. Such a barrier layer has, for example, a function of inhibiting liquid and air from passing through the resin substrate 1, a function of preventing light from passing through the resin substrate 1, and the like. The barrier film is, for example, a film formed of polyvinylidene chloride (PVDC), ethylene-vinyl alcohol copolymer (EVOH), polyacrylonitrile (PAN), polyvinyl alcohol (PVA), or the like. The inorganic vapor deposition film is a film obtained by depositing aluminum, alumina, silica, or the like on a resin film.

The primer layer 2 is a layer contributing improvement of adhesion between the resin substrate 1 and the inorganic vapor deposition layer 3, and contains a urethane compound. The primer layer 2 has a thickness, for example, in the range of 0.01 μm or more and 2 μm or less. The primer layer 2 may preferably have a thickness in the range of 0.05 μm or more and 1 μm or less. When the primer layer 2 has a thickness of 0.01 μm or more, the characteristics of the primer layer 2 are successfully exhibited. When the primer layer 2 has a thickness of 2 μm or less, a reduction in flexibility of the gas barrier laminate 10A can be more successfully prevented. Thus, when the gas barrier laminate 10A is bent, occurrence of cracking in the primer layer 2 can be better prevented. The primer layer 2 is formed, for example, by applying, to the first surface 1a of the resin substrate 1, a liquid (anchor coating liquid) containing organosilane or an organometallic compound, a polyol compound, an isocyanate compound, and the like (described later). A solvent of the anchor coating liquid is, for example, a polar solvent. The anchor coating liquid is applied to the first surface 1a, for example, by a known method such as offset printing, gravure printing, roll coating, or doctor blading.

The primer layer 2 contains, for example, a reaction product of organosilane or an organometallic compound, a polyol compound, and an isocyanate compound. Thus, the primer layer 2 also serves as a urethane adhesive layer. The organosilane is, for example, trifunctional organosilane, or a hydrolysate of trifunctional organosilane. A metal element contained in the organometallic compound is, for example, Al, Ti, Zr, or the like. The organometallic compound is, for example, a metal alkoxide, or a hydrolysate of metal alkoxide. The hydrolysate of organosilane and the hydrolysate of metal alkoxide may each have at least one hydroxyl group. From the viewpoint of reactivity of the polyol compound with the isocyanate compound, the polyol compound may be a polymer compound. In this case, from the viewpoint of transparency, the polyol compound may be an acrylic polyol. The isocyanate compound mainly functions as a crosslinking agent or a curing agent. The isocyanate compound may be a monomer or a polymer.

The inorganic vapor deposition layer 3 is, for example, a layer having gas barrier properties against water vapor (water barrier properties), and is located on the primer layer 2. The inorganic vapor deposition layer 3 contains an inorganic oxide. Examples of the inorganic oxide include aluminum oxide, silicon oxide, magnesium oxide, and tin oxide. From the viewpoint of transparency and water barrier properties of the inorganic vapor deposition layer 3, the inorganic oxide may be selected from the group consisting of aluminum oxide, silicon oxide, and magnesium oxide. The inorganic vapor deposition layer 3 has a thickness, for example, in the range of 5 nm or more and 100 nm or less, and may preferably have a thickness in the range of 10 nm or more and 50 nm or less. When the inorganic vapor deposition layer 3 has a thickness of 5 nm or more, water barrier properties against water vapor are successfully exhibited. When the inorganic vapor deposition layer 3 has a thickness of 100 nm or less, a reduction in flexibility of the gas barrier laminate 10A can be more successfully prevented. Thus, when the gas barrier laminate 10A is bent, occurrence of cracking in the inorganic vapor deposition layer 3 can be better prevented. The inorganic vapor deposition layer 3 may contain a plurality of types of inorganic oxides.

The inorganic vapor deposition layer 3 is a vapor deposition layer formed, for example, by physical vapor deposition, chemical vapor deposition, or the like. The physical vapor deposition is, for example, vacuum vapor deposition, sputtering, ion plating, or the like. From the viewpoint of improvement in adhesion of the inorganic vapor deposition layer 3 to the primer layer 2 and denseness of the inorganic vapor deposition layer 3, a plasma assisted method, an ion beam assisted method, or the like may be performed. From the viewpoint of improvement in transparency of the inorganic vapor deposition layer 3, during the formation of the inorganic vapor deposition layer 3, oxygen gas or the like may be supplied into a production chamber.

The first coating layer 5a is, for example, a layer having gas barrier properties against oxygen (oxygen barrier properties), and is located on the inorganic vapor deposition layer 3. The first coating layer 5a contains a carboxylic acid polymer. The first coating layer 5a has a thickness, for example, in the range of 0.01 µm or more and 5 µm or less, and may preferably have a thickness in the range of 0.02 µm or more and 3 µm or less, and more preferably in the range of 0.04 µm or more and 1.2 µm or less. When the first coating layer 5a has a thickness of 0.01 µm or more, the oxygen barrier properties are successfully exhibited. When the first coating layer 5a has a thickness of 5 µm or less, a reduction in flexibility of the gas barrier laminate 10A can be more successfully prevented. The thickness of the first coating layer 5a can be adjusted so that a ratio of the thickness of the second coating layer 5b to the thickness of the first coating layer 5a (described later) is in a predetermined range. The first coating layer 5a is formed, for example, by applying, onto the inorganic vapor deposition layer 3, a coating solution containing at least a carboxylic acid polymer. The coating solution is applied onto the inorganic vapor deposition layer 3 in the same manner as in the case of the primer layer. A solvent of the coating solution needs to contain at least one of water and an organic solvent.

Examples of the carboxylic acid polymer contained in the first coating layer 5a include an ethylenically unsaturated carboxylic acid polymer; a copolymer of an ethylenically unsaturated carboxylic acid monomer and another ethylenically unsaturated monomer; and acidic polysaccharides having a carboxy group in a molecule of alginic acid, carboxymethyl cellulose, pectin, or the like. The ethylenically unsaturated carboxylic acid may be, for example, acrylic acid, methacrylic acid, itaconic acid, maleic acid, fumaric acid, or crotonic acid. The ethylenically unsaturated monomer may be, for example, a saturated carboxylic acid vinyl ester monomer (ethylene, propylene, vinyl acetate, or the like), an alkyl acrylate monomer, an alkyl methacrylate monomer, an alkyl itaconate monomer, vinyl chloride, vinylidene chloride, styrene, acrylamide, acrylonitrile, or the like. The first coating layer 5a may contain a plurality of types of carboxylic acid polymers. The carboxylic acid polymer may be a polymer of monomers having two or more carboxy groups.

From the viewpoint of oxygen barrier properties of the first coating layer 5a, the carboxylic acid polymer may be a polymer containing a constituent unit derived from at least one polymerizable monomer selected from the group consisting of acrylic acid, maleic acid, methacrylic acid, itaconic acid, fumaric acid, and crotonic acid. In this case, a ratio of the constituent unit in the polymer may be 80 mol % or more, or 90 mol % or more.

The carboxylic acid polymer has a number average molecular weight, for example, in the range of 2,000 or more and 10,000,000 or less. The carboxylic acid polymer may preferably have a number average molecular weight in the range of 5,000 or more and 1,000,000 or less. When the carboxylic acid polymer has a number average molecular weight of 2,000 or more, the first coating layer 5a has sufficient water resistance. Thus, deterioration, due to moisture, of the oxygen barrier properties of the first coating layer 5a and blushing of the first coating layer 5a can be more successfully prevented. When the carboxylic acid polymer has a number average molecular weight of 10,000,000 or less, the first coating layer 5a can be easily formed. The number average molecular weight of the carboxylic acid polymer is obtained by gel permeation chromatography (GPC) and expressed relative to polystyrene.

From the viewpoint of improvement of adhesion between the inorganic vapor deposition layer 3 and the first coating layer 5a, the first coating layer 5a may contain at least one silicon-containing compound selected from the group consisting of a silane coupling agent, a hydrolysate of the silane coupling agent, and condensates of the silane coupling agent and the hydrolysate. In addition, in this case, heat resistance, water resistance, and the like of the first coating layer 5a can be improved. The silane coupling agent is, for example, γ-glycidoxypropyltrimethoxysilane, γ-glycidoxypropyltriethoxysilane, γ-aminopropyltrimethoxysilane, γ-aminopropyltriethoxysilane, or the like. The hydrolysate of the silane coupling agent is a hydrolysate in which at least one of alkyl groups bound to oxygen of the coupling agent is substituted by a hydroxyl group. The condensate of the silane coupling agent is, for example, a condensate in which Si—OH groups of hydrolysates of two molecules are condensed to form a Si—O—Si bond (siloxane bond). When the first coating layer 5a contains a silicon-containing compound, a mass ratio of the carboxylic acid polymer to the silicon-containing compound is, for example, in the range 99.5/0.5 to 80/20. In this case, the gas barrier laminate 10A having good abuse resistance is obtained. Furthermore, separation of the inorganic vapor deposition layer 3 and the first coating layer 5a is less likely to occur. In addition, the first coating layer 5a is more likely to have a uniform thickness, and the first coating layer 5a can have good acid resistance.

A part of the carboxy group contained in the carboxylic acid polymer may be neutralized with a basic compound in advance. In this case, the oxygen barrier properties of the first coating layer 5a can be further improved. In addition, the heat resistance of the first coating layer 5a can also be improved. Examples of the basic compound include a polyvalent metal compound, a monovalent metal compound, and ammonia. The polyvalent metal compound is, for example, the same as a polyvalent metal compound contained in the second coating layer 5b (described later in detail). The basic compound which is a polyvalent metal compound is, for example, zinc oxide, calcium carbonate, sodium carbonate, or the like. The basic compound which is a monovalent metal compound is, for example, sodium hydroxide, potassium hydroxide, or the like.

In the present embodiment, the first coating layer 5a contains at least cations constituting a basic compound. The cations are polyvalent metal ions diffused from the second coating layer 5b to the first coating layer 5a. Thus, in the present embodiment, ionic crosslinking is formed by the polyvalent metal ions and the carboxy groups. In other words, the first coating layer 5a has a crosslinked structure in which the carboxylic acid polymers are crosslinked with each other via the polyvalent metal ions. Thus, the first coating layer 5a can exhibit good oxygen barrier properties. For example, the gas barrier laminate 10A has an oxygen permeability of 0.1 cc/m$^2$·day·atm or less.

The first coating layer 5a may contain various additives. Examples of the additives include a plasticizer, a resin, a dispersant, a surfactant, a softener, a stabilizer, an anti-blocking agent, a film forming agent, a tackifier, and an oxygen absorber.

The second coating layer 5b is, for example, a layer that has a function of supplying polyvalent metal ions to the first coating layer 5a so that a crosslinked structure of the carboxylic acid polymers is formed in the first coating layer 5a to improve the oxygen barrier properties, and a function of absorbing hydrogen sulfide that causes retort odor. The second coating layer 5b is located on the first coating layer 5a, and contains a polyvalent metal compound and a resin.

The second coating layer 5b has a thickness, for example, in the range of 0.10 μm or more and 0.50 μm or less, and may preferably have a thickness in the range of 0.19 μm or more and 0.42 μm or less. When the second coating layer 5b has a thickness of 0.10 μm or more, the second coating layer 5b can contain a sufficient amount of polyvalent metal compound, and it is possible to sufficiently prevent deterioration of the oxygen barrier properties by heat treatment such as retort treatment or boiling treatment. When the second coating layer 5b has a thickness of 0.50 μm or less, a reduction in flexibility of the second coating layer 5b can be more successfully prevented. The thickness of the second coating layer 5b can be adjusted so that the ratio of the thickness of the second coating layer 5b to the thickness of the first coating layer 5a (described later) is in a predetermined range.

The second coating layer 5b is formed, for example, by applying, onto the first coating layer 5a, a coating solution containing a polyvalent metal compound and a resin. The coating solution is applied onto the first coating layer 5a in the same manner as in the case of the primer layer.

In the present embodiment, the ratio of the thickness of the second coating layer 5b to the thickness of the first coating layer 5a (the thickness of the second coating layer 5b/the thickness of the first coating layer 5a) is in the range of 1.0 or more and 4.0 or less, and may be preferably in the range of 1.1 or more and 3.0 or less. If the ratio is less than 1.0, it is difficult to achieve both oxygen barrier properties and prevention of retort odor. If the ratio exceeds 4.0, the second coating layer 5b has an excessively large thickness and causes deterioration of coatability.

The polyvalent metal compound contained in the second coating layer 5b is, for example, polyvalent metal, or oxide, hydroxide, carbonate, organic acid salt (e.g., acetate), or inorganic acid salt of polyvalent metal, or the like. The polyvalent metal compound may be an ammonium complex or secondary to quaternary amine complexes of polyvalent metal oxide, or carbonate or organic acid salt thereof. Examples of the polyvalent metal of the polyvalent metal compound contained in the second coating layer 5b include an alkaline earth metal, transition metal, and aluminum. The alkaline earth metal is, for example, beryllium, magnesium, or calcium. The transition metal is, for example, titanium, zirconium, chromium, manganese, iron, cobalt, nickel, copper, zinc, or the like. From the viewpoint of heat resistance, manufacturability, and the like, the polyvalent metal compound may be an oxide, hydroxide, chloride, carbonate, or acetate of alkaline earth metal, cobalt, nickel, copper, zinc, or aluminum. Alternatively, from the above viewpoint, the polyvalent metal compound may be an ammonium complex of copper or zinc. From the viewpoint of industrial productivity, the polyvalent metal compound may be zinc oxide, aluminum oxide, calcium hydroxide, calcium carbonate, zinc acetate, or calcium acetate. Furthermore, considering the viewpoint of heat resistance, water resistance, and transparency, the polyvalent metal compound may be zinc oxide or calcium carbonate. In the present embodiment, the polyvalent metal compound is zinc oxide.

The content of the polyvalent metal compound is, for example, in the range of 65 mass % or more and 85 mass % or less relative to the mass of the second coating layer 5b. In the case where the content is 65 mass % or more, when hydrogen sulfide enters the gas barrier laminate 10A from the second coating layer 5b side, the hydrogen sulfide is successfully captured in the second coating layer 5b. In other words, when hydrogen sulfide enters the gas barrier laminate 10A from the second coating layer 5b side, diffusion of the hydrogen sulfide (sulfur ions) to the first coating layer 5a is more successfully prevented. In addition, at least some of the polyvalent metal ions are diffused to the first coating layer 5a. Thus, a crosslinked structure as described above is formed in the first coating layer 5a, and accordingly the oxygen barrier properties of the first coating layer 5a can be successfully exhibited. Therefore, when the content is 65 mass % or more, it is possible to form the gas barrier laminate 10A capable of achieving both oxygen barrier properties and prevention of retort odor.

When the content is 85 mass % or less, loss of the polyvalent metal compound from the second coating layer 5b can be better prevented. In addition, in the present embodiment, since the polyvalent metal compound is zinc oxide, when the content is 85 mass % or less, light transmissivity of the second coating layer 5b can be ensured.

The resin contained in the second coating layer 5b is, for example, an alkyd resin, a melamine resin, an acrylic resin, a urethane resin, a polyester resin, a phenol resin, an amino resin, a fluororesin, an epoxy resin, an isocyanate resin, or the like. From the viewpoint of dispersibility of the polyvalent metal compound, the coating solution for forming the second coating layer 5b may contain a dispersant (e.g., anionic surfactant, nonionic surfactant) and the like. In addition, the coating solution may contain a softener, a stabilizer, a film forming agent, a thickener, and the like.

In the present embodiment, the second coating layer 5b satisfies at least one of the following conditions 1 to 3:

(condition 1) a haze of the second coating layer 5b is 8% or less;

(condition 2) a surface roughness Ra of the second coating layer 5b is ½ or less of the thickness of the second coating layer 5b; and (condition 3) the number of concave portions having a diameter of 1.5 µm or more per unit area on a surface of the second coating layer 5b opposite to the first coating layer 5a is 2/0.01 mm² or less.

The condition 1 specifies that the haze of the second coating layer 5b is 8% or less. When the haze is 8% or less, good oxygen barrier properties can be exhibited. From this viewpoint, the haze may be preferably 6% or less, and more preferably 4% or less.

The condition 2 specifies that the surface roughness Ra of the second coating layer 5b is ½ or less of the thickness of the second coating layer 5b. When the surface roughness Ra is ½ or less of the thickness of the second coating layer 5b, good oxygen barrier properties can be exhibited. From this viewpoint, the surface roughness Ra of the second coating layer 5b may be ⅓ or less, or ¼ or less of the thickness of the second coating layer 5b. The surface roughness Ra of the second coating layer 5b may be less than 0.1 µm, or may be 0.075 µm or less. From the viewpoint that the second coating layer 5b may contain a predetermined amount or more (e.g., 65 mass % or more) of polyvalent metal compound, a lower limit of the surface roughness Ra of the second coating layer 5b may be ¹⁄₂₀ of the thickness of the second coating layer 5b, or may be 0.01 µm.

Figure 2:
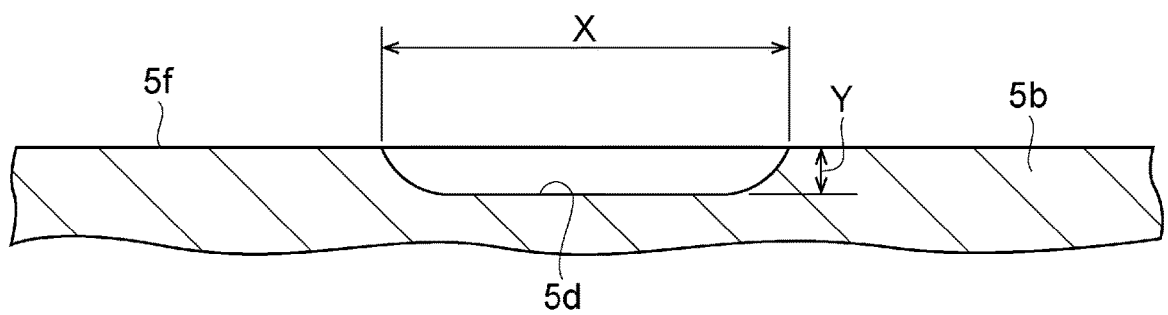
FIG. 2 is a schematic cross-sectional view showing a concave portion that may be present in a second coating layer of the gas barrier laminate shown in FIG. 1.

The condition 3 specifies that the number of concave portions having a diameter of 1.5 µm or more per unit area on the surface of the second coating layer 5b opposite to the first coating layer 5a is 2/0.01 mm² or less. FIG. 2 is a schematic cross-sectional view of the second coating layer 5b, and shows a state where a concave portion 5d having a diameter X of 1.5 µm or more is formed on a surface 5f of the second coating layer 5b opposite to the first coating layer 5a. When the number of concave portions 5d per unit area on the surface 5f is 2/0.01 mm² or less, it is possible to sufficiently prevent deterioration of the oxygen barrier properties of the gas barrier laminate 10A by heat treatment such as retort treatment or boiling treatment. If the number of concave portions 5d per unit area exceeds 2/0.01 mm², the surface 5f of the second coating layer 5b is rough and non-uniform. Thus, when the gas barrier laminate 10A in the state of a packaging material accommodating the contents is subjected to heat treatment, hydrogen sulfide generated from the contents is more likely to pass through the second coating layer 5b and reach the first coating layer 5a. As a result, the crosslinked structure of the first coating layer 5a is destroyed, leading to deterioration of the oxygen barrier properties of the gas barrier laminate 10A. From the viewpoint of further preventing deterioration of the oxygen barrier properties of the gas barrier laminate 10A, the number of concave portions 5d per unit area is more preferably 1/0.01 mm² or less, and most preferably 0/0.01 mm².

In the present specification, the number of concave portions 5d per unit area is measured by the following method. First, the surface 5f of the second coating layer 5b is observed by using a scanning electron microscope (SEM), and an enlarged image of a visual field of 0.1 mm×0.1 mm is captured. Then, the number of concave portions 5d having a diameter of 1.5 µm or more shown in the image is counted. Thus, the number of concave portions 5d having a diameter of 1.5 µm or more per unit area (unit: the number of concave portions/0.01 mm²) is obtained. A flat surface of the concave portion 5d when viewed from a direction perpendicular to the surface 5f of the second coating layer 5b does not need to have a circular shape, and may have an elliptical shape, a polygonal shape, or an irregular shape, or may have a combination of two or more of these shapes. When the flat surface of the concave portion 5d does not have a circular shape, the diameter X of the concave portion 5d means a maximum diameter of the shape of the flat surface of the concave portion 5d.

A concave portion having a diameter of less than 1.5 µm on the surface 5f of the second coating layer 5b has little influence on the oxygen barrier properties, and the number of such concave portions is not particularly limited. From the viewpoint of more sufficiently preventing deterioration of the oxygen barrier properties of the gas barrier laminate 10A by heat treatment, the number of concave portions having a diameter of 1.0 µm or more per unit area on the surface 5f of the second coating layer 5b is preferably 2/0.01 mm² or less, more preferably 1/0.01 mm² or less, and most preferably 0/0.01 mm².

A depth (maximum depth) Y of the concave portion 5d having a diameter of 1.5 µm or more is not particularly limited, and is, for example, 50% or more of the thickness of the second coating layer 5b. The concave portion 5d having such a depth has a significant influence on the oxygen barrier properties.

The number of concave portions having a depth of 50% or more of the thickness of the second coating layer 5b (the diameter of the concave portions is not limited) per unit area on the surface 5fa of the second coating layer 5b is preferably 2/0.01 mm² or less, more preferably 1/0.01 mm² or less, and most preferably 0/0.01 mm². When the number of concave portions having the above depth per unit area is 2/0.01 mm² or less, it is possible to more sufficiently prevent deterioration of the oxygen barrier properties of the gas barrier laminate 10A by heat treatment such as retort treatment or boiling treatment. The depth of the concave portion can be measured, for example, by using a scanning probe microscope (SPM). The concave portions having a depth of 50% or more of the thickness of the second coating layer 5b and the concave portions 5d having a diameter of 1.5 µm or more may be common concave portions satisfying both of the conditions.

The number of concave portions 5d having a diameter of 1.5 µm or more per unit area on the surface 5f of the second coating layer 5b is 2/0.01 mm² or less, for example, by adjusting a method of forming the second coating layer 5b.

The method of forming the second coating layer 5b that satisfies at least one of the conditions 1 to 3 is preferably a method in which the coating solution containing the components of the second coating layer 5b described above is applied to a surface of the first coating layer 5a by gravure printing. More specifically, a cylinder (plate cylinder) used for the gravure printing is preferably a cylinder having a ceramic-coated surface. The ceramic-coated cylinder has good wettability to the coating solution, and allows uniform application of the coating solution to the surface of the cylinder and uniform transfer of the coating solution to the first coating layer 5a. Thus, the second coating layer 5b that satisfies at least one of the conditions 1 to 3 is easily formed.

Usually, as the second coating layer 5b is formed to have a larger thickness, for example, due to non-uniformity of the thickness or the components, the second coating layer 5b has a higher haze and a higher surface roughness Ra, and the concave portions 5d are more likely to be formed on the surface 5f. However, when the second coating layer 5b is formed by the method described above, even if the second coating layer 5b has a sufficiently large thickness, for example, in the range of 0.1 µm or more and 0.5 µm or less, the second coating layer 5b that satisfies at least one of the conditions 1 to 3 can be stably formed. The second coating layer 5b may satisfy two of the conditions 1 to 3, or may satisfy three of the conditions 1 to 3.

<Packaging Material and Package>

Figure 3:
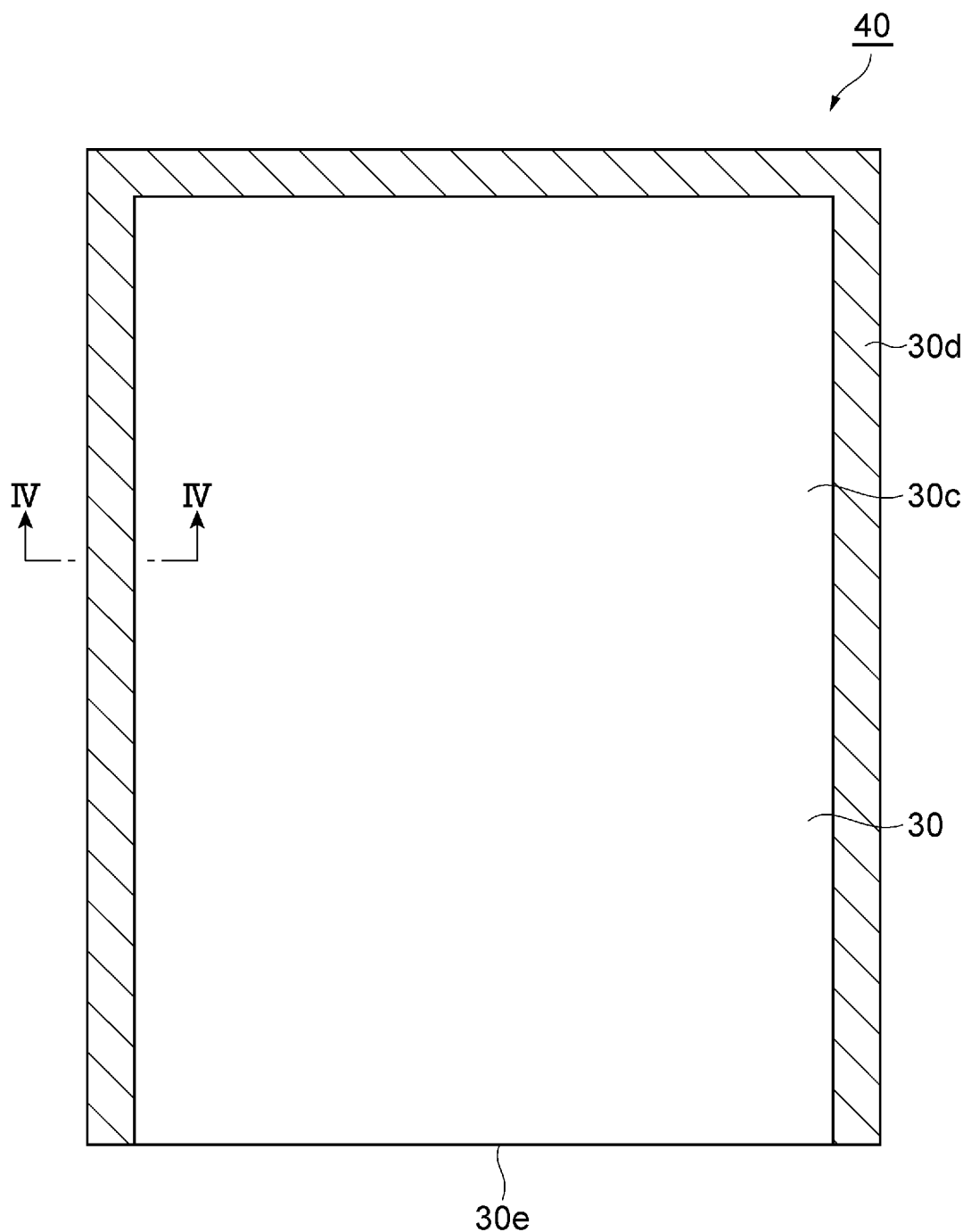
FIG. 3 is a schematic plan view of a package.
Figure 4:
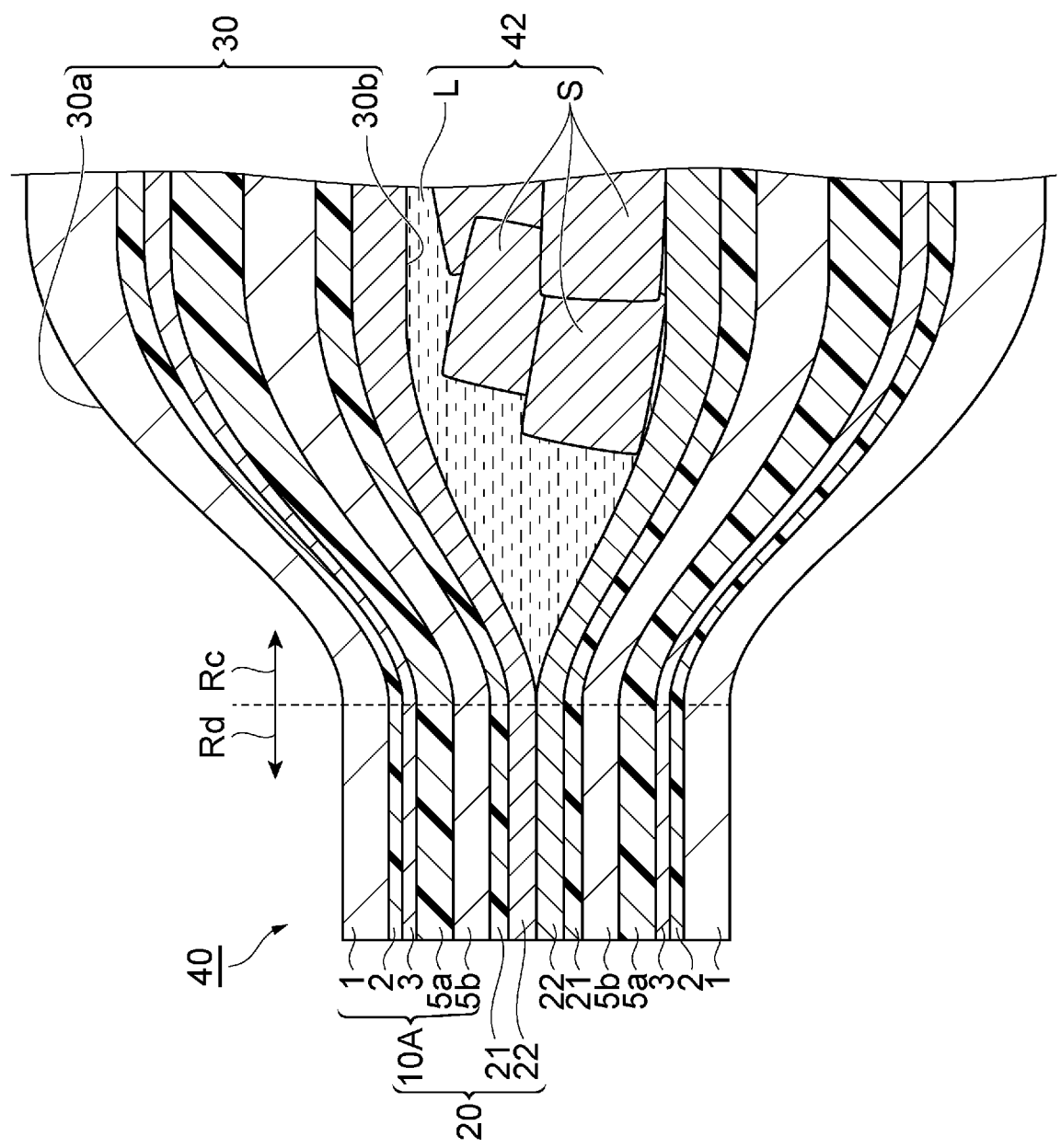
FIG. 4 is a cross-sectional view taken along line IV-IV in FIG. 3.
Figure 5A:
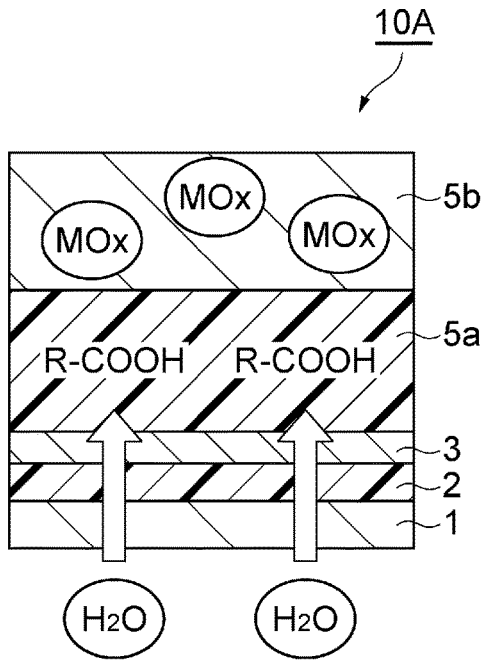
FIGS. 5(a) to (d) are schematic cross-sectional views illustrating a change in the gas barrier laminate during retort treatment.
Figure 5B:
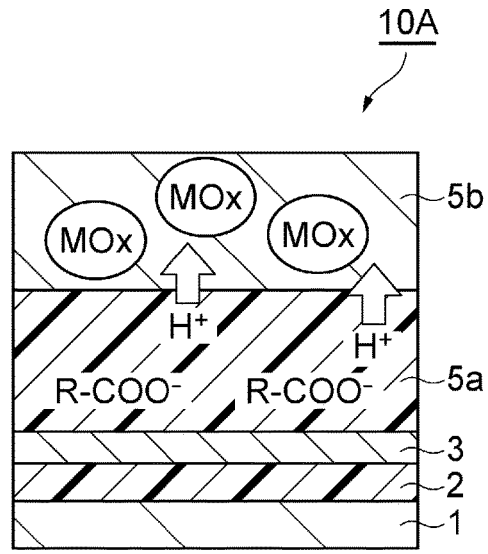
Figure 5C:
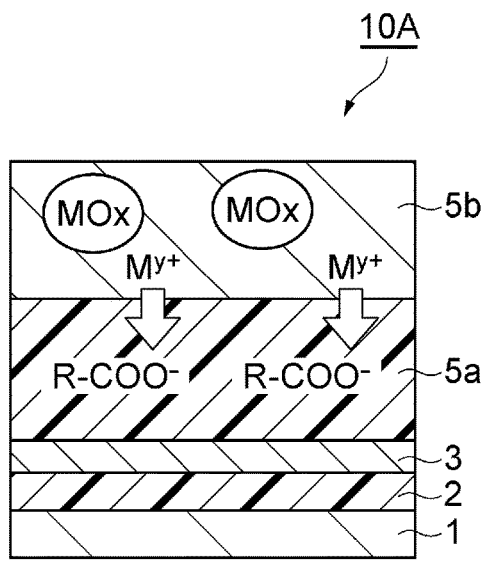
Figure 5D:
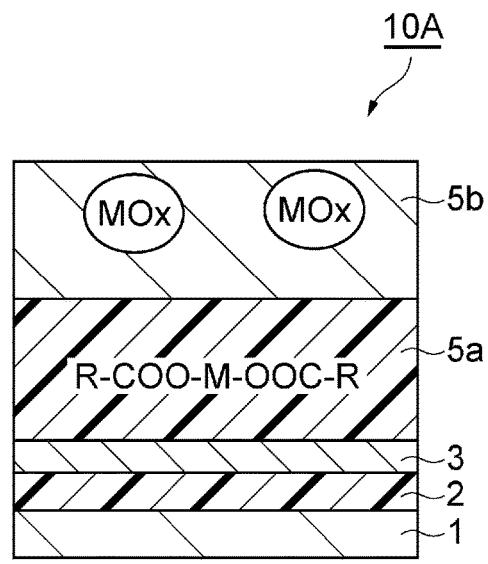

Next, a structure of a package formed by using the gas barrier laminate according to the present embodiment will be described with reference to FIGS. 3 and 4. FIG. 3 is a schematic plan view of the package. FIG. 4 is a cross-sectional view taken along line IV-IV in FIG. 3.

A package 40 is composed of a packaging material 30 and contents 42 accommodated in the packaging material 30. The packaging material 30 is formed in a bag shape using a sheet (packaging film) 20. The sheet 20 includes the gas barrier laminate 10A, a bonding layer 21 located on the second coating layer 5b, and a sealant layer 22 located on the bonding layer 21. The bonding layer 21 is a layer for bonding the gas barrier laminate 10A to the sealant layer 22. The sealant layer 22 is a layer for sealing portions of the sheet 20 overlapped so that portions of the sealant layer 22 face each other.

The bonding layer 21 contains, for example, linear low-density polyethylene (LLDPE), polyurethane, polypropylene, an ethylene-unsaturated ester copolymer resin, a polyester copolymer resin, or the like. The sealant layer 22 is a resin layer serving as an inner surface of the packaging material 30, and is, for example, an unstretched polypropylene film (CPP film). The bonding layer 21 has a thickness, for example, in the range of 1 μm or more and 5 μm or less, and the sealant layer has a thickness, for example, in the range of 10 μm or more and 100 μm or less. The bonding layer 21 is formed, for example, by being applied onto the second coating layer 5b. The sealant layer 22 is formed, for example, by being applied onto the bonding layer 21.

The packaging material 30 is formed in a bag shape by folding the sheet 20 in half and then heat sealing the sides of the sheet 20. An outer surface 30a of the packaging material 30 is composed of the resin substrate 1, and an inner surface 30b of the packaging material 30 is composed of the sealant layer 22. From the outer side toward the inner side of the packaging material 30, the resin substrate 1, the primer layer 2, the inorganic vapor deposition layer 3, the first coating layer 5a, the second coating layer 5b, the bonding layer 21, and the sealant layer 22 are laminated in this order.

The packaging material 30 has a body portion 30c in which the contents 42 are accommodated, a sealed portion 30d located at an edge of the body portion 30c, and a bent portion 30e at which the sheet 20 is bent. The body portion 30c is a region Rc shown in FIG. 4, and the sealed portion 30d is a region Rd shown in FIG. 4. The contents 42 contain, for example, a liquid L and solids S. The liquid L is, for example, water, oil, a soft drink, an alcoholic beverage, an organic solvent, or the like. The solids S are meat, beans, or the like containing a sulfur-containing amino acid. The sulfur-containing amino acid is, for example, methionine or cysteine. The cysteine is, for example, L-cysteine (2-amino-3-sulfanyl propionic acid: $HSCH_2CH(NH_2)COOH$), and is expressed by the following formula (1).

[Chem. 1]

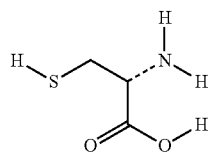

(1)

The sealed portion 30d is a portion at which parts of the sheet 20 are heated and compressed. Thus, at the sealed portion 30d, the resins of the sealant layer 22 facing each other are melted and mixed, and heat sealed.

The package 40 may be subjected to retort treatment or boiling treatment. Thus, a crosslinked structure as described above is formed in the first coating layer 5a, and the formed crosslinked structure remains without being destroyed. Accordingly, the oxygen barrier properties of the gas barrier laminate 10A are successfully exhibited.

Figure 6A:
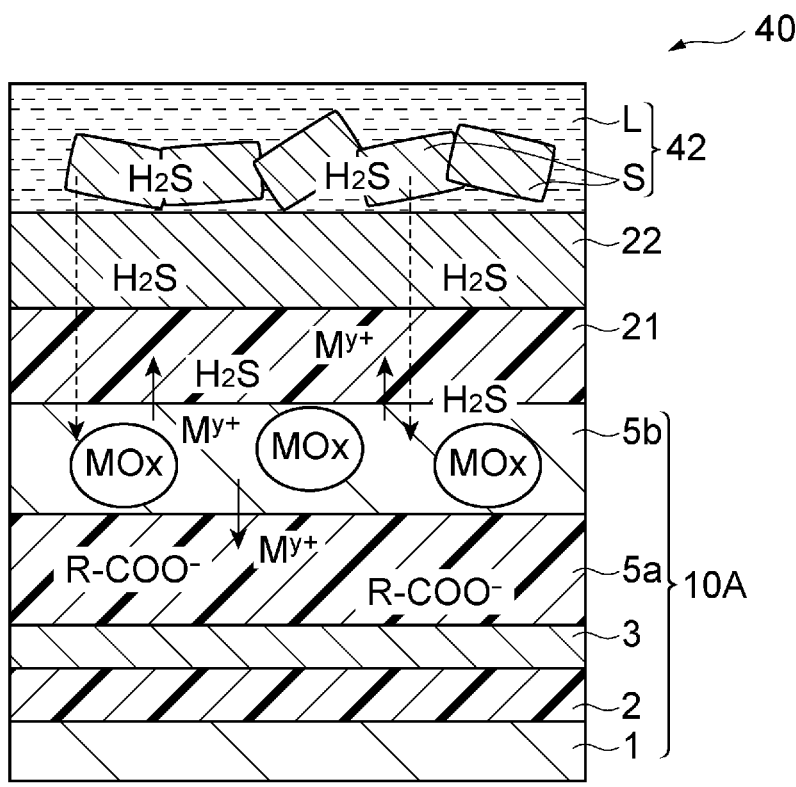
FIGS. 6(a) and (b) are schematic cross-sectional views illustrating a change in the package during retort treatment.
Figure 6B:
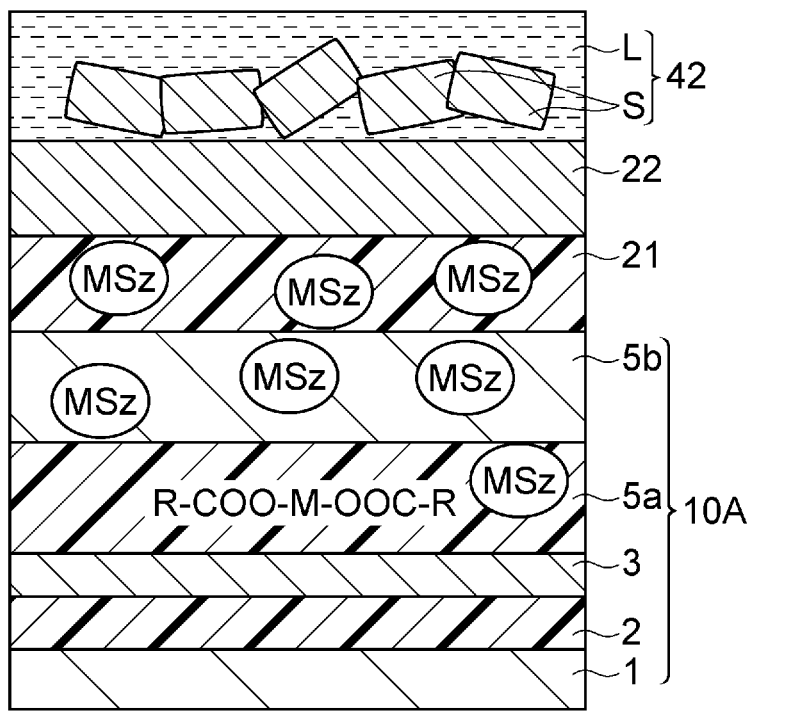

Next, advantageous effects obtained by the package 40 including the gas barrier laminate 10A will be described with reference to the drawings. FIGS. 5 (a) to (d) are schematic diagrams illustrating a change in the gas barrier laminate during retort treatment. FIGS. 6 (a) and (b) are schematic diagrams illustrating a change in the package during retort treatment. In the retort treatment, the gas barrier laminate 10A and the package 40 are each assumed to be heated by water vapor at 125° C. for 30 minutes. The resin substrate 1 side of the gas barrier laminate 10A is exposed to the water vapor. In FIGS. 5 (a) to (d), "R—COOH" represents a carboxylic acid polymer, "R—COO—" represents a carboxylic acid polymer in which a hydrogen ion has been liberated from a carboxy group, "$MO_x$" represents a polyvalent metal compound, "$M^{y+}$" represents a polyvalent metal ion, and "R—COO-M-OOC—R" represents a structure of the carboxylic acid polymers crosslinked via the polyvalent metal ions.

First, a change in the gas barrier laminate 10A during the retort treatment will be described with reference to FIGS. 5 (a) to (d). As shown in FIG. 5 (a), during the retort treatment, water vapor (moisture) at a high temperature enters the gas barrier laminate 10A via the resin substrate 1. Thus, as shown in FIG. 5 (b), hydrogen ions ($H^+$) of the carboxy groups of the carboxylic acid polymers are liberated. At least some of the liberated hydrogen ions move to the second coating layer 5b. Subsequently, as shown in FIG. 5 (c), the hydrogen ions that have moved to the second coating layer 5b reduce the polyvalent metal compounds. Thus, polyvalent metal ions are generated from the polyvalent metal compounds. Some of the polyvalent metal ions move to the first coating layer 5a. Then, as shown in FIG. 5 (d), via the polyvalent metal ions that have moved to the first coating layer 5a, the carboxylic acid polymers form a crosslinked structure. Thus, during the retort treatment, the carboxylic acid polymers chemically react with the polyvalent metal compounds, thereby improving the oxygen barrier properties of the first coating layer 5a. In addition, the polyvalent metal compounds that remain in the second coating layer 5b have an effect of absorbing retort odor. Therefore, for example, when applying retort treatment to the gas barrier laminate 10A, the gas barrier laminate 10A has good oxygen barrier properties and an effect of preventing retort odor.

Next, a change in the package 40 during the retort treatment will be described with reference to FIGS. 6 (a) and (b). As shown in FIG. 6 (a), during the retort treatment, the change described above occurs in the gas barrier laminate 10A. Furthermore, the sulfur-containing amino acid contained in the solids S of the contents 42 is heated and reacted with water to generate hydrogen sulfide (H2S) that causes retort odor. For example, when the sulfur-containing amino acid is cysteine, hydrogen sulfide is generated as shown in the following chemical reaction formula.

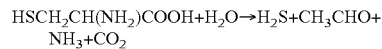

The hydrogen sulfide passes through the sealant layer 22 and the bonding layer 21, and enters the gas barrier laminate 10A via the second coating layer 5b. The hydrogen sulfide that has entered the second coating layer 5b chemically reacts with the polyvalent metal compound contained in the second coating layer 5b. Thus, polyvalent metal sulfide is generated in the second coating layer 5b, and the hydrogen sulfide is captured by the second coating layer 5b. Therefore, the package 40 including the gas barrier laminate 10A can prevent retort odor.

As described above, the ratio of the thickness of the second coating layer 5b to the thickness of the first coating layer 5a is in the range of 1.0 or more and 4.0 or less, and the second coating layer 5b satisfies at least one of the conditions 1 to 3. Thus, by using the gas barrier laminate 10A, most of the hydrogen sulfide that has entered the gas barrier laminate 10A is captured by the second coating layer 5b. That is, the hydrogen sulfide (sulfur ions) is more successfully prevented from reaching the first coating layer 5a. In some cases, part of the hydrogen sulfide that has entered the gas barrier laminate 10A reaches the first coating layer 5a. However, since most of the hydrogen sulfide is captured by the second coating layer 5b, the sulfur-containing content in the first coating layer 5a after retort treatment can be kept extremely low (e.g., 1.0 atm % or less). Thus, the crosslinked structure of the first coating layer 5a can be better prevented from being destroyed by the sulfur ions. Therefore, even when hydrogen sulfide is generated from the contents 42, the oxygen barrier properties of the gas barrier laminate 10A are sufficiently exhibited.

In the present embodiment, the second coating layer 5b has a thickness in the range of 0.10 μm or more and 0.50 μm or less. Thus, the second coating layer 5b can contain a sufficient amount of polyvalent metal compound. Furthermore, a reduction in flexibility of the second coating layer 5b can be more successfully prevented.

In the present embodiment, the polyvalent metal compound is zinc oxide, and the content of the zinc oxide is in the range of 65 mass % or more and 85 mass % or less relative to the mass of the second coating layer 5b. Thus, it is possible to provide the gas barrier laminate 10A that has light transmissivity and can achieve both oxygen barrier properties and prevention of retort odor. In the present embodiment, after being subjected to the retort treatment, the first coating layer 5a has the crosslinked structure in which the carboxylic acid polymers are crosslinked with each other via the polyvalent metal ions. Thus, the oxygen barrier properties of the first coating layer 5a are successfully exhibited.

In the present embodiment, the gas barrier laminate 10A includes the primer layer 2 that is located between the resin substrate 1 and the inorganic vapor deposition layer 3 and contains a urethane compound. Thus, separation of the resin substrate 1 and the inorganic vapor deposition layer 3 is better prevented.

The gas barrier laminate according to an aspect of the present disclosure and the packaging material including the gas barrier laminate are not limited to the above embodiment. For example, in the above embodiment, the contents contain both a liquid and a solid, but the present disclosure is not limited to this. The contents may contain only one of a liquid and a solid. When the contents contain only a liquid, the liquid may contain a sulfur-containing amino acid. Furthermore, the packaging material 30 may accommodate the contents in the form of liquid, semisolid, or gel. That is, the packaging material 30 may accommodate a substance such as a liquid in which surface tension can be applied. Specific examples of the contents include food products such as water, oil, drinks, yogurt, jelly, curry, pudding, syrup, jam, mousse, rice porridge, and soup, pharmaceutical products, cosmetics, and chemical products. Alternatively, the packaging material 30 may accommodate, for example, sterilized sanitary products, medical supplies, solid food products, or the like.

Figure 7:
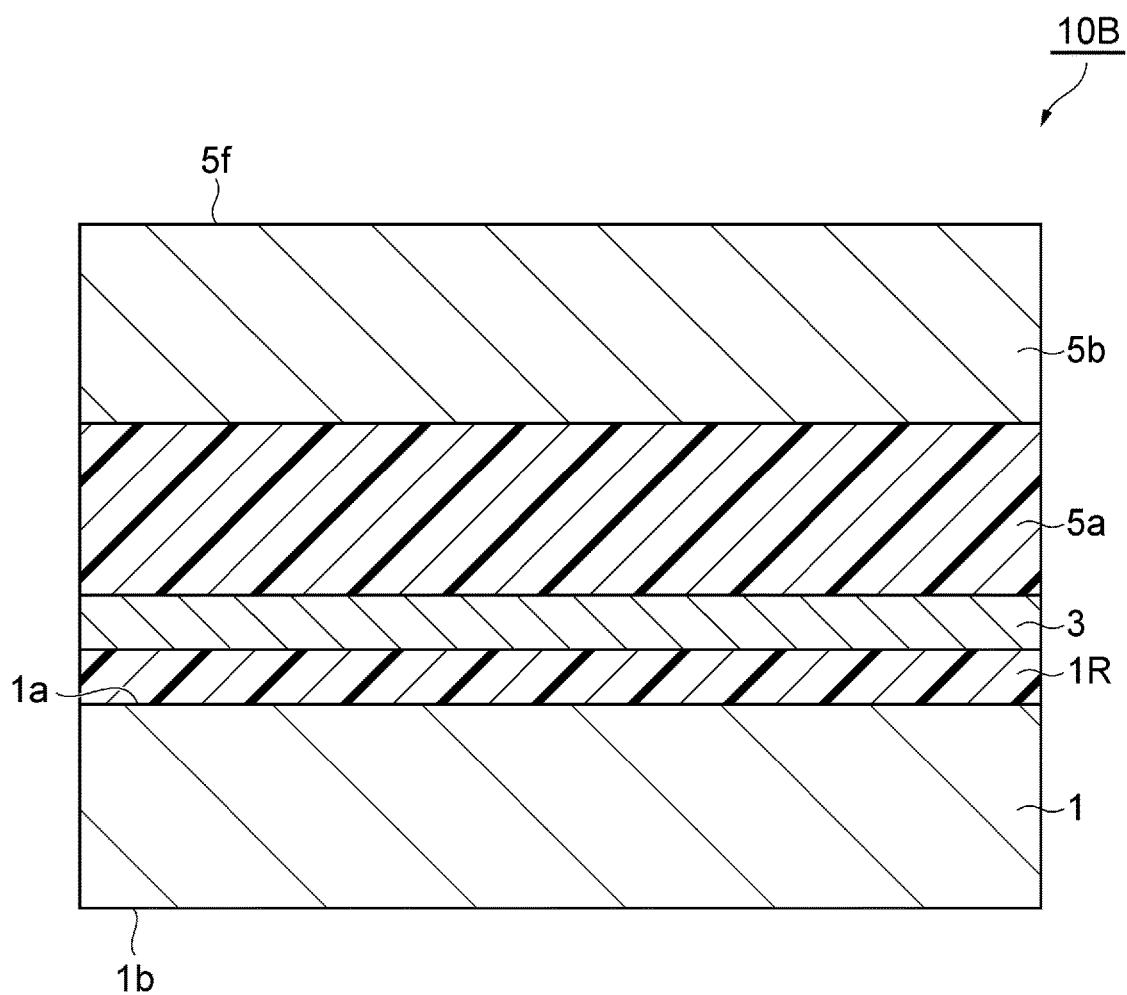
FIG. 7 is a schematic cross-sectional view showing a modification of the first embodiment shown in FIG. 1.

The gas barrier laminate 10A includes the primer layer 2, but the present disclosure is not limited to this. That is, the gas barrier laminate may include no primer layer 2. Instead of the primer layer 2, the gas barrier laminate may include a modification treatment layer formed by applying reactive ion etching (hereinafter also referred to as "RIE") treatment to the first surface 1a of the resin substrate 1. The modification treatment layer indicates a portion that is located in the vicinity of the surface of the resin substrate 1 and has been modified to be layered by RIE treatment. A gas barrier laminate 10B shown in FIG. 7 includes a modification treatment layer 1R between the resin substrate 1 and the inorganic vapor deposition layer 3.

In the RIE treatment, plasma is used. Radicals and ions generated in the plasma provide a chemical effect of imparting the surface of the resin substrate 1 with a functional group. Further, ion etching provides a physical effect of removing surface impurities and increasing surface roughness. Thus, due to the modification treatment layer exhibiting the chemical effect and the physical effect due to the RIE treatment, adhesion between the resin substrate 1 and the inorganic vapor deposition layer 3 is improved, and separation of the resin substrate 1 and the inorganic vapor deposition layer 3 is less likely to occur even under a high-temperature and high-humidity environment. Therefore, the heat resistance of the entire gas barrier laminate is improved, and when the gas barrier laminate is subjected to heat treatment such as boiling treatment, retort treatment, or cooking, it is possible to prevent occurrence of delamination between the resin substrate 1 and the inorganic vapor deposition layer 3, deterioration of the gas barrier properties, and the like.

The ME treatment of the resin substrate 1 may be performed by using a known ME plasma treatment device. The plasma treatment device is preferably a roll-type in-line plasma treatment device. The roll-type in-line plasma treatment device may be a planar plasma treatment device, a hollow anode plasma treatment device, or the like.

An example of a method of applying ME treatment to the surface of the resin substrate 1 by a planar plasma treatment device will be described below. A planar plasma treatment device 50A shown in FIG. 8 includes, in a vacuum chamber, an electrode (cathode) 51 and a cylindrical treatment roll 52 that holds the resin substrate 1, and the electrode 51 is arranged on an inner side of the treatment roll 52. When gas used for the RIE treatment is introduced to an outer side of the treatment roll 52 and a voltage is applied to the electrode 51 while the resin substrate 1 is conveyed along the treatment roll 52, plasma is generated on the outer side of the treatment roll 52, and radicals in the plasma are attracted toward the treatment roll serving as a counter electrode and act on the surface of the resin substrate 1. Since the resin substrate 1 is placed on the electrode 51 side serving as the cathode, a high self-bias is obtained on the resin substrate 1. Due to the high self-bias, ions I in the plasma are attracted toward the resin substrate 1, and a sputtering effect (physical effect) is applied to the surface of the resin substrate 1. In this manner, the surface of the resin substrate 1 is subjected to the RIE treatment. When plasma treatment is performed by using a device in which the electrode 51 to which a voltage is applied is arranged on the outer side of the treatment roll 52, the resin substrate 1 is arranged on the anode side. In this case, a high self-bias is not obtained, and only radicals act on the resin substrate 1. The act of the radicals is only a chemical reaction, and only the chemical reaction cannot sufficiently improve adhesion between the resin substrate 1 and the inorganic vapor deposition layer 3.

Figure 9:
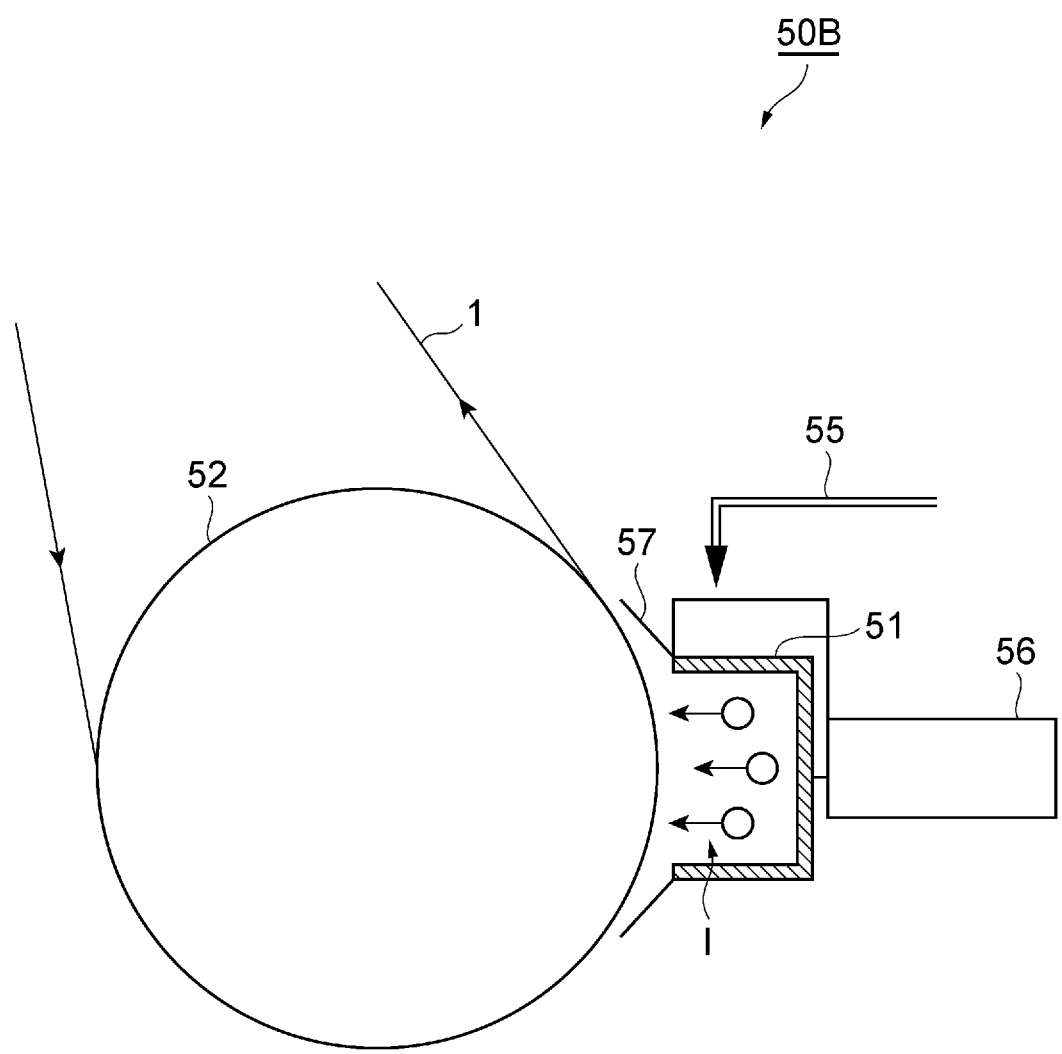
FIG. 9 is a schematic diagram showing an example of a mode in which a film surface is subjected to ME treatment by using a hollow anode plasma treatment device.

Next, an example of a method of applying RIE treatment to the surface of the resin substrate 1 by a hollow anode plasma treatment device will be described. A hollow anode plasma treatment device 50B shown in FIG. 9 includes, in a vacuum chamber, the electrode (anode) 51, the treatment roll 52 that holds the resin substrate 1 and functions as a counter electrode (cathode) of the electrode 51, a matching box 56 for matching impedance, a gas introduction nozzle 55, and a shielding plate 57 arranged at each of both sides of the electrode 51. The electrode 51 has a box shape opened on the treatment roll 52 side. The gas introduction nozzle 55 is arranged above the electrode 51 so that gas used for the RIE treatment can be introduced into a gap between the treatment roll 52 and each of the electrode 51 and the shielding plate 57. The matching box 56 is arranged behind the electrode 51 and connected to the electrode 51. The shielding plate 57 has a curved surface along an outer periphery of the treatment roll 52, and is arranged on the outer side of the treatment roll 52 to face the treatment roll 52. The electrode 51 has the box shape opened toward the treatment roll 52 side, and thus an area (Sa) of the electrode 51 is larger than an area (Sc) of a treatment surface of the resin substrate 1 serving as a counter electrode, i.e., a size of the opening of the electrode (Sa>Sc).

When in the hollow anode plasma treatment device 50B, gas is introduced into the gap between the treatment roll 52 and each of the electrode 51 and the shielding plate 57 and a voltage is applied to the electrode 51 from the matching box 56 while the resin substrate 1 is conveyed along the treatment roll 52, plasma is generated inside the box-shaped electrode 51, and radicals in the plasma are attracted toward the treatment roll 52 serving as a counter electrode and act on the surface of the resin substrate 1. Since Sa>Sc, a high self-bias is generated on the resin substrate 1. Due to the high self-bias, ions I in the plasma are attracted toward the resin substrate 1, and a sputtering effect (physical effect) is applied to the surface of the resin substrate 1. In this manner, the surface of the resin substrate 1 is subjected to the RIE treatment. When plasma treatment is performed by using a device that does not satisfy Sa>Sc, a high self-bias is not obtained, and only radicals act on the resin substrate 1. The act of the radicals is only a chemical reaction, and only the chemical reaction cannot sufficiently improve adhesion between the resin substrate 1 and the inorganic vapor deposition layer 3.

The hollow anode plasma treatment device may be a magnetically assisted hollow anode plasma treatment device in which a magnet is further incorporated in the box-shaped electrode to form a magnetic electrode. A magnetic field generated from the magnetic electrode further enhances a plasma confinement effect, and due to a high self-bias, a high ion current density can be obtained. Thus, the RIE treatment can be performed at high speed in a stronger and more stable manner.

Examples of the gas used for the RIE treatment include argon, oxygen, nitrogen, and hydrogen. These gases may be used alone or in combination of two or more. In the RIE treatment, two or more plasma treatment devices do not have to be of the same type. For example, the resin substrate 1 may be subjected to treatment using a planar plasma treatment device, successively followed by treatment using a hollow anode plasma treatment device.

In the package of the above embodiment, the bonding layer 21 is in contact with the second coating layer 5b, but the present disclosure is not limited to this. For example, an intermediate layer may be provided between the bonding layer 21 and the second coating layer 5b. Furthermore, a printing layer may be provided on the second coating layer 5b. The printing layer contains, for example, a coating material for displaying characters, figures, or the like, and a transparent resin.

In the above embodiment, after the gas barrier laminate is subjected to retort treatment, the first coating layer 5a has the crosslinked structure of the carboxylic acid polymers via the polyvalent metal ions, but the present disclosure is not limited to this. The first coating layer 5a may have the crosslinked structure before being subjected to retort treatment. In this case, even when the gas barrier laminate is not subjected to retort treatment, the gas barrier laminate has good oxygen barrier properties.

Second Embodiment

Figure 10:
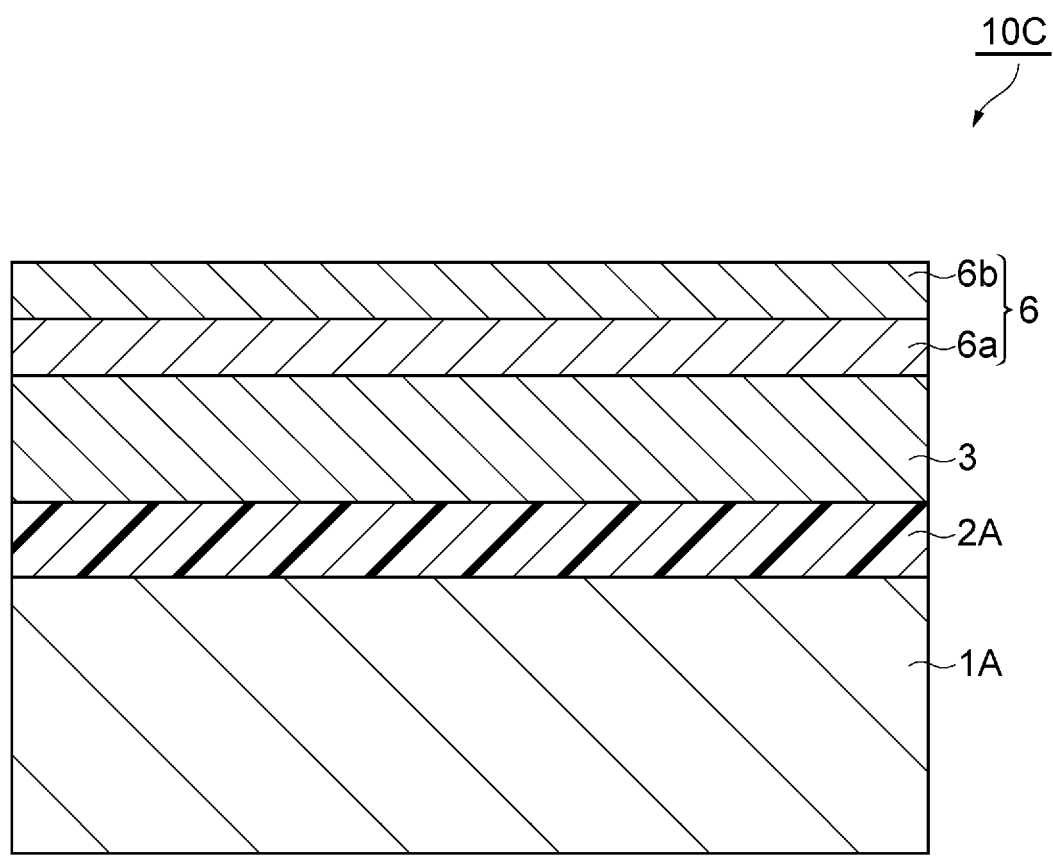
FIG. 10 is a schematic cross-sectional view showing a second embodiment of a gas barrier laminate according to the present disclosure.

A gas barrier laminate 10C according to a second embodiment shown in FIG. 10 is configured such that on a plastic substrate 1A (film substrate), an adhesive layer 2A, the inorganic vapor deposition layer 3, and a coating layer 6 are sequentially laminated. The adhesive layer 2A and the inorganic vapor deposition layer 3 are not essential, and a layer having another function may be laminated as necessary. For example, functional layers such as a surface protective layer, a sealant layer, and a pattern layer may be laminated. These functional layers may be a monolayer or a combination of a plurality of layers.

Figure 11:
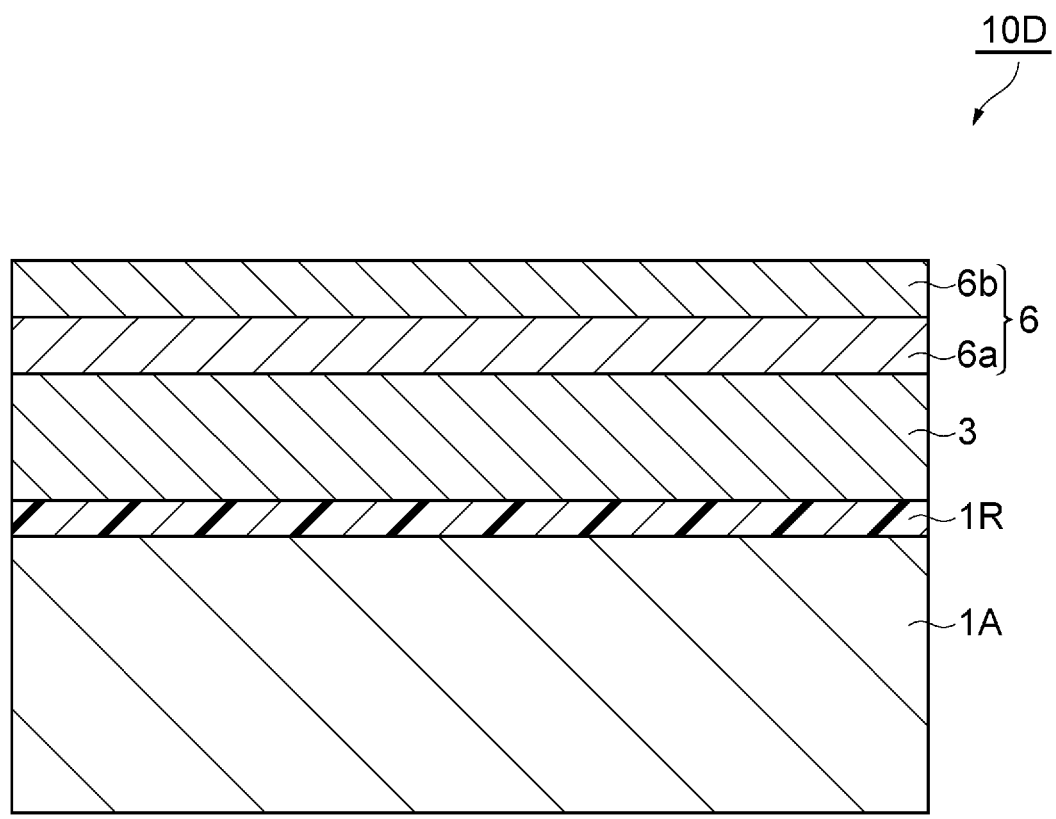
FIG. 11 is a schematic cross-sectional view showing a modification of the second embodiment shown in FIG. 10.

FIG. 11 shows a modification of the gas barrier laminate 10C according to the second embodiment shown in FIG. 10. A gas barrier laminate 10D shown in FIG. 11 is configured such that on the plastic substrate 1A, the modification treatment layer 1R formed by reactive ion etching (hereinafter also referred to as "RIE") treatment, the inorganic vapor deposition layer 3, and the coating layer 6 are sequentially laminated. The RIE treatment may be performed by using the planar plasma treatment device 50A and/or the hollow anode plasma treatment device 50B described above (see FIGS. 8 and 9). A layer having another function may be laminated as necessary. For example, functional layers such as a surface protective layer, a sealant layer, and a pattern layer may be laminated. These functional layers may be a monolayer or a combination of a plurality of layers. The lamination surface of the plastic substrate 1A may be subjected to various types of pretreatment such as corona treatment and flame treatment to such an extent that the barrier properties are not impaired.

The plastic substrate 1A is not particularly limited, and may be any known film that is transparent and maintains the shape at a heating temperature of 200° C. or more. Examples of the plastic substrate 1A include polyester films (polyethylene terephthalate, polyethylene naphthalate, and the like), polyamide films (nylon 6, nylon 66, and the like), polystyrene films, polyvinyl chloride films, polyimide films, polycarbonate films, polyether sulfone films, acrylic films, and cellulose films (triacetyl cellulose, diacetyl cellulose, and the like). The plastic substrate 1A is not particularly limited, but is preferably a film having a low heat shrinkage ratio.

In practice, the plastic substrate 1A is preferably selected as appropriate according to the intended use and required physical properties. For packaging of medical supplies, chemical agents, food products, or the like, a polyethylene terephthalate film, a polyamide film, or the like may be used. The thickness of the film is not particularly limited. A film having a thickness in the range of approximately 6 μm to 200 μm may be used according to the intended use.

To such an extent that the barrier properties are not impaired, the lamination surface of the plastic substrate 1A may be subjected to various types of pretreatment such as corona treatment, plasma treatment, and flame treatment, or may have a coating layer such as an adhesion-enhancing layer.

The adhesive layer 2A is provided on the plastic substrate 1A for the purpose of achieving two effects. One is to improve adhesion between the plastic substrate 1A and the inorganic vapor deposition layer 3. The other is to smooth the surface to form a uniform inorganic vapor deposition layer without defects in a subsequent step, and compensate for fine barrier defects of the vapor deposition film to exhibit high barrier properties.

A material for forming the adhesive layer 2A satisfying the above effects is preferably a nonaqueous resin. Examples of such a resin include a silane coupling agent, organic titanate, polyacrylic, polyester, polyurethane, polycarbonate, polyurea, polyamide, polyolefin emulsion, polyimide, melamine, and phenol. Considering hot-water resistance of the adhesive layer, the material more preferably contains an organic polymer having at least one or more urethane bonds or urea bonds.

The urethane bond and the urea bond may be a polymer introduced in advance during polymerization. The organic polymer having a urethane bond may be formed, for example, by reaction of a polyol such as an acrylic or methacrylic polyol with an isocyanate compound having an isocyanate group, or by reaction of an amine resin having an amino group with an epoxy compound having an epoxy group or a glycidyl group. The organic polymer having a urea bond may be formed by reaction of an isocyanate compound with water or a solvent such as ethyl acetate or with an amine resin having an amino group.

As a result of intensive study, the inventors have found that the adhesive layer made of a nonaqueous resin is more preferably a composite of an acrylic polyol or a polyester polyol with an isocyanate compound, a silane coupling agent, and the like.

The acrylic polyol refers to a polymer compound having a terminal hydroxyl group among polymer compounds obtained by polymerizing acrylic acid derivative monomers and polymer compounds obtained by copolymerizing acrylic acid derivative monomers with other monomers. The acrylic polyol is reacted with an isocyanate group of an isocyanate compound added later.

The polyester polyol refers to a polyester resin having two or more terminal hydroxyl groups among polyester resins obtained from acid materials and alcohol materials by a known production method. Examples of the acid materials include terephthalic acid, isophthalic acid, phthalic acid, methylphthalic acid, trimellitic acid, pyromellitic acid, adipic acid, sebacic acid, succinic acid, maleic acid, fumaric acid, tetrahydrophthalic acid, methyltetrahydrophthalic acid, hexahydrophthalic acid, and reactive derivatives thereof. Examples of the alcohol materials include ethylene glycol, propylene glycol, 1,3-butanediol, 1,4-hexanediol, diethylene glycol, dipropylene glycol, 1,4-cyclohexane dimethanol, neopentyl glycol, bishydroxyethyl terephthalate, trimethylolmethane, trimethylolpropane, glycerin, and pentaerythritol. The polyester polyol is reacted with an isocyanate group of an isocyanate compound added later.

The isocyanate compound is added to enhance adhesion with a substrate or an inorganic oxide by a urethane bond that is formed by reaction with an acrylic polyol or a polyester polyol. The isocyanate compound mainly acts as a crosslinking agent or a curing agent. To achieve this, the isocyanate compound may be a monomer such as aromatic tolylene diisocyanate (TDI) or diphenylmethane diisocyanate (MDI) or aliphatic xylene diisocyanate (XDI) or hexamethylene diisocyanate (HMDI), or a polymer or a derivative thereof. These materials may be used alone, as a mixture of two or more, or the like.

The silane coupling agent may be a silane coupling agent having any organic functional group. Examples of the silane coupling agent include ethyltrimethoxysilane, vinyl trimethoxysilane, γ-chloropropylmethyldimethoxysilane, γ-chloropropyltrimethoxysilane, glycidoxypropyltrimethoxysilane, γ-methacryloxypropyltrimethoxysilane, and γ-methacryloxypropylmethyldimethoxysilane, and hydrolysates thereof. These materials may be used alone or in combination of two or more.

A method of applying the coating solution may be a conventionally known common method such as casting, dipping, roll coating, gravure coating, screen printing, reverse coating, spray coating, kit coating, die coating, metering bar coating, chamber doctor combined coating, or curtain coating.

The inorganic vapor deposition layer 3 may be formed of a material having high barrier properties such as aluminum oxide (AlOx), silicon oxide (SiOx), magnesium fluoride (MgF$_2$), magnesium oxide (MgO), or indium tin oxide (ITO). From the viewpoint of material cost, barrier properties, and transparency, the inorganic vapor deposition layer 3 is preferably formed of aluminum oxide or silicon oxide which is an inorganic oxide.

The inorganic vapor deposition layer 3 preferably has a thickness in the range of 20 nm to 200 nm. This is because if the inorganic vapor deposition layer 3 has a thickness of 10 nm or less, continuity of the thin film is inadequate, and if the inorganic vapor deposition layer 3 has a thickness of more than 300 nm, curling or cracking is more likely to occur, leading to deterioration of the barrier properties and flexibility. The thickness of the inorganic vapor deposition layer 3 may be set as appropriate according to the intended use.

The inorganic vapor deposition layer 3 can be formed by a vacuum film forming method. The vacuum film forming method is preferable from the viewpoint of barrier properties and uniformity of the film. The film forming method may be a known method such as vacuum vapor deposition, sputtering, or chemical vapor deposition (CVD). Due to a high film forming speed and high productivity, the vacuum vapor deposition is preferable. Of the vacuum vapor deposition methods, in particular, a film forming method using electron beam heating is effective. This is because the film forming speed can be easily controlled by an irradiation area, an electron beam current, or the like and because a temperature of a vapor deposition material can be increased or decreased in a short time.

The coating layer 6 includes a first coating layer 6a described below and a second coating layer 6b containing a polyvalent metal compound.

The first coating layer 6a is a layer containing a polycarboxylic acid polymer (A1) (hereinafter referred to as "(A1) component") and at least one silicon-containing compound (A2) (hereinafter referred to as "(A2) component") selected from the group consisting of a silane coupling agent expressed by the following general formula (1), a hydrolysate of the silane coupling agent, and condensates of the silane coupling agent and the hydrolysate at a mass ratio in the range of 99.5:0.5 to 80.0:20.0 (the mass of the (A2) component is expressed in terms of the silane coupling agent).

[where $R^1$ is an organic group having a glycidyloxy group or an amino group, $R^2$ is an alkyl group, and the three $R^2$ may be equal to or different from each other.]

In a state where many of the carboxy groups of the (A1) component in the first coating layer 6a have not formed ionic crosslinking, the first coating layer 6a has flexibility. Accordingly, when the gas barrier laminate is subjected to abuse such as stretching, defects are less likely to occur in the first coating layer 6a. Thus, when after the abuse, the gas barrier laminate is subjected to at least one treatment selected from the group consisting of retort treatment, boiling treatment, and humidity conditioning treatment, deterioration of the gas barrier properties is less likely to occur.

Furthermore, since the gas barrier laminate includes the second coating layer 6b as well as the first coating layer 6a, when the gas barrier laminate is subjected to at least one treatment selected from the group consisting of retort treatment, boiling treatment, and humidity conditioning treatment, the (A1) component contained in the first coating layer 6a reacts with the polyvalent metal compound contained in the second coating layer 6b, and the carboxy groups of the (A1) component and the polyvalent metal ions form ionic crosslinking. Thus, the gas barrier laminate can have good gas barrier properties.

[First Coating Layer 6a]

The polycarboxylic acid polymer, which is the (A1) component, is a polymer having two or more carboxy groups in a molecule.

Examples of the (A1) component include an ethylenically unsaturated carboxylic acid (co)polymer; a copolymer of ethylenically unsaturated carboxylic acid and another ethylenically unsaturated monomer; and acidic polysaccharides having a carboxyl group in a molecule of alginic acid, carboxymethyl cellulose, pectin, or the like.

Examples of the ethylenically unsaturated carboxylic acid include acrylic acid, methacrylic acid, itaconic acid, maleic acid, fumaric acid, and crotonic acid.

Examples of the ethylenically unsaturated monomer copolymerizable with the ethylenically unsaturated carboxylic acid include saturated carboxylic acid vinyl esters such as ethylene, propylene, and vinyl acetate, alkyl acrylates, alkyl methacrylates, alkyl itaconates, vinyl chloride, vinylidene chloride, styrene, acrylamide, and acrylonitrile.

These polycarboxylic acid polymers may be used alone or as a mixture of two or more.

Of the above materials, from the viewpoint of gas barrier properties of a gas barrier laminate to be obtained, the (A1) component is preferably a polymer containing a constituent unit derived from at least one polymerizable monomer selected from the group consisting of acrylic acid, maleic acid, methacrylic acid, itaconic acid, fumaric acid, and crotonic acid. The (A1) component is particularly preferably a polymer containing a constituent unit derived from at least one polymerizable monomer selected from the group consisting of acrylic acid, maleic acid, methacrylic acid, and itaconic acid.

In the polymer, a ratio of the constituent unit derived from at least one polymerizable monomer selected from the group consisting of acrylic acid, maleic acid, methacrylic acid, and itaconic acid is preferably 80 mol % or more, and more preferably 90 mol % or more (the total constituent units constituting the polymer is 100 mol %). The polymer may be a homopolymer or a copolymer.

When the polymer is a copolymer containing an additional constituent unit other than the above constituent units, the additional constituent unit may be, for example, a constituent unit derived from the above-described ethylenically unsaturated monomer copolymerizable with the ethylenically unsaturated carboxylic acid.

The (A1) component preferably has a number average molecular weight in the range of 2,000 to 10,000,000, and more preferably in the range of 5,000 to 1,000,000. If the (A1) component has a number average molecular weight of less than 2,000, a gas barrier laminate to be obtained cannot achieve sufficient water resistance, and moisture may cause deterioration of gas barrier properties and transparency or may cause occurrence of blushing. On the other hand, if the (A1) component has a number average molecular weight of more than 10,000,000, in some cases, during formation of a layer (A) by application of the material, high viscosity causes deterioration of coatability.

In the (A1) component, a part of the carboxy group may be neutralized with a basic compound in advance. By neutralizing in advance a part of the carboxyl group of the (A1) component, the water resistance and the heat resistance can be further improved. The basic compound is preferably at least one basic compound selected from the group consisting of a polyvalent metal compound, a monovalent metal compound, and ammonia.

Examples of the polyvalent metal compound are the same as those of a polyvalent metal compound to be mentioned in description of the second coating layer 6b. Examples of the basic compound which is a polyvalent metal compound include zinc oxide, calcium carbonate, and sodium carbonate. Examples of the basic compound which is a monovalent metal compound include sodium hydroxide and potassium hydroxide.

When the first coating layer 6a is formed by drying a coating film formed of a coating solution (a) containing the (A1) component and the (A2) component, from the viewpoint of coatability and coating liquid stability of the coating solution (a), the degree of neutralization of the carboxy group is preferably 30 mol % or less, and more preferably 25 mol % or less. The materials of the (A1) component may be used alone or as a mixture of two or more.

The (A2) component is at least one silicon-containing compound selected from the group consisting of a silane coupling agent expressed by the following general formula (1) (hereinafter may be referred to as "silane coupling agent (1)"), a hydrolysate of the silane coupling agent, and condensates of the silane coupling agent and the hydrolysate. Even a small amount of (A2) component can improve adhesion between the inorganic vapor deposition layer 3 and the first coating layer 6a, heat resistance, water resistance, and the like.

[where $R^1$ is an organic group having a glycidyloxy group or an amino group, $R^2$ is an alkyl group, and the three $R^2$ may be equal to or different from each other.]

In the general formula (1), examples of the organic group of R1 include a glycidyloxyalkyl group and an aminoalkyl group. The alkyl group of $R^2$ is preferably an alkyl group having a carbon number of 1 to 6, and particularly preferably a methyl group or an ethyl group.

Specific examples of the silane coupling agent (1) include γ-glycidoxypropyltrimethoxysilane, γ-glycidoxypropyltriethoxysilane, γ-aminopropyltrimethoxysilane, and γ-aminopropyltriethoxysilane. Of these, the silane coupling agent (1) is preferably γ-glycidoxypropyltrimethoxysilane or γ-aminopropyltrimethoxysilane.

The (A2) component may be the silane coupling agent (1) itself, may be a hydrolysate obtained by hydrolysis of the silane coupling agent (1), or may be a condensate of the silane coupling agent (1) or the hydrolysate.

The hydrolysate may be a hydrolysate in which at least one of the three $OR^2$ in the general formula (1) is OH. The condensate may be a condensate in which Si—OH groups of the hydrolysate of at least two molecules are condensed to form a Si—O—Si bond. Hereinafter, the condensate of the hydrolysate of the silane coupling agent may be referred to as hydrolyzed condensate.

The (A2) component may be a compound obtained by hydrolysis or condensation reaction of the silane coupling agent (1), for example, by using a sol-gel method. Usually, in the silane coupling agent (1), hydrolysis easily occurs, and in the presence of acid or alkali, condensation reaction easily occurs. Accordingly, the presence of only the silane coupling agent (1), only the hydrolysate of the silane coupling agent, or only the condensates of the silane coupling agent and the hydrolysate is rare. That is, usually in the (A2) component, the silane coupling agent (1), the hydrolysate of the silane coupling agent, and the condensates of the silane coupling agent and the hydrolysate are mixed together. The hydrolysate may be a partial hydrolysate or a complete hydrolysate.

The (A2) component preferably contains at least a hydrolyzed condensate. As a method of producing a hydrolyzed condensate, the silane coupling agent (1) may be directly mixed with a liquid containing the (A1) component and water, or water may be added to a silane coupling agent (1) to perform hydrolysis and condensation reaction subsequent to the hydrolysis, thereby obtaining a hydrolyzed condensate before the silane coupling agent (1) is mixed with the polycarboxylic acid polymer.

The first coating layer 6a contains the (A1) component and the (A2) component at a mass ratio in the range of 99.5:0.5 to 80.0:20.0. The mass of the (A2) component is expressed in terms of the silane coupling agent (1). Specifically, as described above, usually in the (A2) component, the silane coupling agent (1), the hydrolysate of the silane coupling agent, and the condensates of the silane coupling agent and the hydrolysate are mixed together. The mass of the (A2) component corresponds to a value in terms of the silane coupling agent (1), i.e., the amount of the silane coupling agent (1) to be used. When the mass ratio is in the above range, a gas barrier laminate having good abuse resistance can be obtained. Furthermore, the gas barrier laminate has good adhesion between the inorganic vapor deposition layer 3 and the coating layer 6, and delamination is less likely to occur. When the (A2) component is contained at a mass ratio in the above range, the first coating layer 6a can be a uniform layer without phase separation.

Furthermore, the presence of the (A2) component allows the gas barrier laminate to have resistance to acid. When in the silane coupling agent (1), R1 is an organic group containing a glycidyloxy group (γ-glycidoxypropyltrimethoxysilane or γ-glycidoxypropyltriethoxysilane), the mass ratio of the (A1) component to the (A2) component is preferably in the range of 99.5:0.5 to 90.0:10.0, and particularly preferably in the range of 99.0:1.0 to 95.0:5.0.

When in the silane coupling agent (1), $R^1$ is an organic group containing an amino group (γ-aminopropyltrimethoxysilane or γ-aminopropyltriethoxysilane), the mass ratio of the (A1) component to the (A2) component is preferably in the range of 99.0:1.0 to 80.0:20.0, and particularly preferably in the range of 95.0:5.0 to 80.0:20.0.

The first coating layer 6a may contain various additives. Examples of the additives include a plasticizer, a resin, a dispersant, a surfactant, a softener, a stabilizer, an anti-blocking agent, a film forming agent, a tackifier, and an oxygen absorber.

For example, the plasticizer may be selected as appropriate from known plasticizers. Specific examples of the plasticizer include ethylene glycol, trimethylene glycol, propylene glycol, tetramethylene glycol, 1,3-butanediol, 2,3-butanediol, pentamethylene glycol, hexamethylene glycol, diethylene glycol, triethylene glycol, polyethylene glycol, polyvinyl alcohol, ethylene-vinyl alcohol copolymer, polyethylene oxide, sorbitol, mannitol, dulcitol, erythritol, glycerin, lactic acid, fatty acid, starch, and phthalate ester.

These plasticizers may be used as a mixture as necessary. Of these plasticizers, from the viewpoint of stretchability and gas barrier properties, the plasticizer is preferably polyethylene glycol, polyvinyl alcohol, ethylene-vinyl alcohol copolymer, glycerin, or starch. When the first coating layer 6a contains such a plasticizer, the abuse resistance can be further improved.

When the first coating layer 6a contains, as an additive, a compound having two or more hydroxyl groups such as polyvinyl alcohol, the hydroxyl group of the compound and a part of the carboxy group of the (A1) component may form an ester bond. When the layer (A) contains an additive, the mass ratio of the (A1) component to the additive ((A1) component:additive) is usually in the range of 70:30 to 99.9:0.1, and preferably in the range of 80:20 to 98:2.

From the viewpoint of gas barrier properties, the first coating layer 6a preferably has a thickness in the range of 0.01 to 5 μm more preferably in the range of 0.02 to 3 μm, and still more preferably in the range of 0.04 to 1.2 μm. Even when the coating layer includes the plurality of layers (A), a preferable total thickness of the layers (A) in the coating layer is the same as described above.

(Method of Forming First Coating Layer 6a)

The first coating layer 6a is usually formed by a coating method. Specifically, the first coating layer 6a can be formed by drying a coating film formed of the coating solution (a) containing the (A1) component and the (A2) component. The (A1) component and the (A2) component contained in the coating solution (a) may be the same as the (A1) component and the (A2) component described above.

The coating solution (a) preferably contains the (A1) component and the (A2) component at a mass ratio in the range of 99.5:0.5 to 80.0:20.0 (the mass of the (A2) component is expressed in terms of the silane coupling agent (1)). The mass ratio in this range is preferable for the same reason as described above. When in the silane coupling agent (1), R1 is an organic group containing a glycidyloxy group (γ-glycidoxypropyltrimethoxysilane or γ-glycidoxypropyltriethoxysilane), the mass ratio of the (A1) component to the (A2) component is preferably in the range of 99.5:0.5 to 90.0:10.0, and particularly preferably in the range of 99.0:1.0 to 95.0:5.0.

When in the silane coupling agent (1), $R^1$ is an organic group containing an amino group (γ-aminopropyltrimethoxysilane or γ-aminopropyltriethoxysilane), the mass ratio of the (A1) component to the (A2) component is preferably in the range of 99.0:1.0 to 80.0:20.0, and particularly preferably in the range of 95.0:5.0 to 80.0:20.0. Usually, the mass ratio of the (A1) component to the (A2) component contained in the coating solution (a) is the same as the mass ratio of the (A1) component to the (A2) component in the layer (A) formed by using the coating solution (a). However, the mass ratios may be different, for example, when the (A1) component reacts with an additive, when the (A1) component reacts with the (A2) component, or the like.

In addition to the (A1) component and the (A2) component, the coating solution (a) may contain the above-described additives as necessary. When the coating solution (a) contains an additive, a preferable range of the mass ratio of the (A1) component to the additive is the same as the range described above.

The coating solution (a) can be prepared by mixing the (A1) component, the (A2) component, and an additive contained as necessary with a solvent. The solvent used for the coating solution (a) is not particularly limited as long as the solvent can dissolve the (A1) component and the (A2) component. Usually, water is required for the hydrolysis reaction of the silane coupling agent (1), and thus the solvent is preferably water, a mixed solvent of water and an organic solvent, or the like. From the viewpoint of solubility of the (A1) component and cost, water is most preferable.

From the viewpoint of improving solubility of the silane coupling agent (1) and coatability of the coating solution (a), an organic solvent such as alcohol is preferable. The organic solvent is preferably at least one organic solvent selected from the group consisting of alcohols having a carbon number of 1 to 5 and ketones having a carbon number of 3 to 5, and the like.

Specific examples of the organic solvent include methanol, ethanol, propanol, isopropanol, n-butanol, isobutanol, sec-butanol, tert-butanol, acetone, and methyl ethyl ketone. The mixed solvent of water and an organic solvent is preferably the mixed solvent of water and an organic solvent described above, and more preferably a mixed solvent of water and an alcohol having a carbon number of 1 to 5. The mixed solvent is preferably a solvent containing 20 to 95 mass % of water and 80 to 5 mass % of organic solvent (the total of the water and the organic solvent is 100 wt %).

In the coating solution (a), from the viewpoint of gas barrier properties and coatability, the total content (solid content) of the (A1) component, the (A2) component, and an additive contained as necessary in the coating solution (a) relative to the total weight of the coating solution (a) is preferably in the range of 0.5 to 50 mass %, more preferably 0.8 to 30 mass %, and particularly preferably in the range of 1.0 to 20 mass %.

The first coating layer 6a can be formed by applying the coating solution (a) to a surface on which the first coating layer 6a is to be laminated (e.g., on the inorganic vapor deposition layer 3 or the like) to form a coating film, and drying the coating film. A method of applying the coating solution (a) is not particularly limited, and may be selected as appropriate from known coating methods. Examples of the method include casting, dipping, roll coating, gravure coating, screen printing, reverse coating, spray coating, kit coating, die coating, metering bar coating, chamber doctor combined coating, and curtain coating. The application amount of the coating solution (a) is set according to the thickness of the first coating layer 6a to be formed.

After the coating solution (a) is applied to form a coating film, the coating film is dried to remove the solvent of the coating solution (a) contained in the coating film, thereby forming the first coating layer 6a. The drying method is not particularly limited. Examples of the drying method include hot air drying, hot roll contact method, infrared heating, and microwave heating. These drying methods may be used alone or in combination of two or more.

The first coating layer 6a formed in this manner contains the (A1) component and the (A2) component. When the coating solution (a) contains an additional component such as an additive, the first coating layer 6a further contains the additional component. When the additive in the coating solution (a) is a compound having two or more hydroxyl groups such as polyvinyl alcohol, during the drying, aging treatment, heat treatment, and the like, the hydroxyl group of the compound may react with a part of the carboxy group of the (A1) component to form an ester bond.

[Second Coating Layer 6b]

The second coating layer 6b contains a polyvalent metal compound. The polyvalent metal compound is a compound of polyvalent metal containing metal ions having a valence of two or more. Examples of the polyvalent metal include alkaline earth metals such as beryllium, magnesium, and calcium; transition metals such as titanium, zirconium, chromium, manganese, iron, cobalt, nickel, copper, and zinc; and aluminum, and silicon. From the viewpoint of heat resistance, water resistance, and transparency, the polyvalent metal is particularly preferably calcium or zinc. That is, the polyvalent metal compound is preferably a calcium compound or a zinc compound.

The polyvalent metal compound is, for example, polyvalent metal, or oxide, hydroxide, carbonate, organic acid salt (e.g., acetate), or inorganic acid salt of polyvalent metal, an ammonium complex or secondary to quaternary amine complexes of polyvalent metal oxide, or carbonate or organic acid salt thereof. Of these polyvalent metal compounds, from the viewpoint of gas barrier properties, resistance to water vapor at a high temperature and hot water, and manufacturability, the polyvalent metal compound is preferably an oxide, hydroxide, chloride, carbonate, or acetate of alkaline earth metal, cobalt, nickel, copper, zinc, aluminum, or silicon, an ammonium complex of copper or zinc, or a carbonate thereof.

Of these polyvalent metal compounds, from the viewpoint of industrial productivity, the polyvalent metal compound is preferably zinc oxide, aluminum oxide, calcium hydroxide, calcium carbonate, zinc acetate, or calcium acetate, and particularly preferably zinc oxide.

When the second coating layer 6b is formed by drying a coating film formed of a coating solution (b) containing a polyvalent metal compound, the polyvalent metal compound may be particulate or not particulate, or may be dissolved. From the viewpoint of dispersibility, gas barrier properties, and productivity, the polyvalent metal compound is preferably particulate. The average particle size of such particles is not particularly limited. From the viewpoint of barrier properties and coating suitability, the average particle size is preferably 5 µm or less, more preferably 1 µm or less, and particularly preferably 0.1 µm or less.

In addition to the polyvalent metal compound, the second coating layer 6b may contain various additives as necessary to such an extent that the effects of the present invention are not impaired. For example, when a layer (B) is formed by drying a coating film formed of the coating solution (b) containing a polyvalent metal compound, the second coating layer 6b may contain, as an additive, a resin that is soluble or dispersible in a solvent used for the coating solution (b), and a dispersant, a surfactant, a softener, a stabilizer, a film forming agent, a thickener, and the like that are soluble or dispersible in the solvent.

Of these additives, the second coating layer 6b preferably contains a resin that is soluble or dispersible in the solvent used for the coating solution (b). Thus, coatability and film formability of the coating solution (b) is improved.

Examples of such a resin include an alkyd resin, a melamine resin, an acrylic resin, a urethane resin, a polyester resin, a phenol resin, an amino resin, a fluororesin, an epoxy resin, and an isocyanate resin.

Furthermore, the second coating layer 6b preferably contains a dispersant that is soluble or dispersible in the solvent used for the coating solution (b). Thus, dispersibility of the polyvalent metal compound is improved. The dispersant may be an anionic surfactant or a nonionic surfactant. Examples of the surfactant include various surfactants such as (poly)carboxylic acid salt, alkyl sulfate ester salt, alkylbenzene sulfonic acid salt, alkylnaphthalene sulfonic acid salt, alkylsulfosuccinic acid salt, alkyl diphenyl ether disulfonic acid salt, alkyl phosphate salt, aromatic phosphate ester, polyoxyethylene alkyl ether, polyoxyethylene alkyl phenol ether, polyoxyethylene alkyl ester, alkylaryl sulfate ester salt, polyoxyethylene alkyl phosphate ester, sorbitan alkyl ester, glycerol fatty acid ester, sorbitan fatty acid ester, sucrose fatty acid ester, polyethylene glycol fatty acid ester, polyoxyethylene sorbitan alkyl ester, polyoxyethylene alkylaryl ether, polyoxyethylene derivative, polyoxyethylene sorbitol fatty acid ester, polyoxy fatty acid ester, and polyoxyethylene alkylamine. These surfactants may be used alone or as a mixture of two or more.

When the second coating layer 6b contains an additive described above, the mass ratio of the polyvalent metal compound to the additive (polyvalent metal compound: additive) is preferably in the range of 30:70 to 99:1, and preferably in the range of 50:50 to 98:2.

From the viewpoint of gas barrier properties, the second coating layer 6b preferably has a thickness in the range of 0.01 to 5 μm, more preferably in the range of 0.03 to 3 μm, and still more preferably in the range of 0.1 to 1.2 μm. Even when the coating layer includes the plurality of second coating layers 6b, a preferable total thickness of the second coating layers 6b in the coating layer is the same as described above.

(Method of Forming Second Coating Layer 6b)

Examples of a method of forming the second coating layer 6b include a coating method and a dipping method. Of these methods, from the viewpoint of productivity, the coating method is preferable. The case where the second coating layer 6b is formed by the coating method will be described below.

Specifically, when the second coating layer 6b is formed by the coating method, the second coating layer 6b can be formed by drying a coating film formed of the coating solution (b) containing a polyvalent metal compound. The polyvalent metal compound contained in the coating solution (b) may be the same as the polyvalent metal compound described above, and is preferably a calcium compound or a zinc compound, and particularly preferably a zinc compound.

In addition to the polyvalent metal compound, the coating solution (b) may contain various additives and the like as necessary to such an extent that the effects of the present invention are not impaired. Examples of the additives include a resin that is soluble or dispersible in a solvent used for the coating solution (b), and a dispersant, a surfactant, a softener, a stabilizer, a film forming agent, and a thickener that are soluble or dispersible in the solvent. Of these additives, for the purpose of improving coatability and film formability of the coating solution (b), the coating solution (b) preferably contains a resin that is soluble or dispersible in the solvent used for the coating solution (b). Examples of such a resin are the same as the resins mentioned above as various additives that may be contained in the second coating layer 6b.

For the purpose of improving dispersibility of the polyvalent metal compound, as an additive, the coating solution (b) preferably contains a dispersant that is soluble or dispersible in the solvent used for the coating solution (b). Examples of the dispersant are the same as the dispersants mentioned above as various additives that may be contained in the second coating layer 6b. When the coating solution (b) contains an additive, the mass ratio of the polyvalent metal compound to the additive (polyvalent metal compound: additive) is preferably in the range of 30:70 to 99:1, and preferably in the range of 50:50 to 98:2.

Examples of the solvent used for the coating solution (b) include water, methyl alcohol, ethyl alcohol, isopropyl alcohol, n-propyl alcohol, n-butyl alcohol, n-pentyl alcohol, dimethyl sulfoxide, dimethylformamide, dimethylacetamide, toluene, hexane, heptane, cyclohexane, acetone, methyl ethyl ketone, diethyl ether, dioxane, tetrahydrofuran, ethyl acetate, and butyl acetate. These solvents may be used alone or as a mixture of two or more.

Of these solvents, from the viewpoint of coatability, the solvent is preferably methyl alcohol, ethyl alcohol, isopropyl alcohol, toluene, ethyl acetate, methyl ethyl ketone, or water. From the viewpoint of manufacturability, the solvent is preferably methyl alcohol, ethyl alcohol, isopropyl alcohol, or water. The layer (A) formed of the coating solution (a) has good water resistance, and thus water can be used as the solvent used for the coating solution (b).

In the coating solution (b), from the viewpoint of coating suitability, the total content of the polyvalent metal compound and the additive in the coating solution (b) relative to the total weight of the coating solution (b) is preferably in the range of 1 to 50 mass %, more preferably 3 to 45 mass %, and particularly preferably in the range of 5 to 40 mass %.

The second coating layer 6b can be formed by applying the coating solution (b) to a surface on which the second coating layer 6b is to be laminated (e.g., the first coating layer 6a or the like) to form a coating film, and drying the coating film. A method of applying the coating solution (b) is not particularly limited, and may be selected as appropriate from known coating methods. Examples of the method include casting, dipping, roll coating, gravure coating, screen printing, reverse coating, spray coating, kit coating, die coating, metering bar coating, chamber doctor combined coating, and curtain coating. The application amount of the coating solution (b) is set according to the thickness of the second coating layer 6b to be formed.

After the coating solution (b) is applied to form a coating film, the coating film is dried to remove the solvent of the coating solution (b) contained in the coating film, thereby forming the second coating layer 6b. The drying method is not particularly limited. Examples of the drying method include hot air drying, hot roll contact method, infrared heating, and microwave heating. These drying methods may be used alone or in combination of two or more. The drying temperature is not particularly limited. When the solvent is water or a mixed solvent of water and an organic solvent described above, the drying temperature is usually preferably in the range from 50 to 160° C. The drying is usually performed under normal pressure or reduced pressure. From the viewpoint of simplicity of the equipment, the drying is preferably performed under normal pressure. The second coating layer 6b formed in this manner contains the polyvalent metal compound. When the coating solution (b)

contains an additional component such as an additive, the second coating layer 6b further contains the additional component.

A heat sterilization treatment method may be only one of retort treatment and boiling treatment, or may be a combination of retort treatment and boiling treatment.

The retort treatment is typically treatment in which pressure sterilization is performed to kill microorganisms such as mold, yeast, and bacteria for preservation of food products or the like. Usually, the pressure sterilization treatment is performed for 10 to 120 minutes at 105 to 140° C. and 0.15 to 0.30 MPa. Retort devices include steam type devices using heated steam and hot water type devices using pressurized superheated water. These types of devices are used as appropriate according to sterilization conditions of the food products or the like to be the contents.

The boiling treatment is treatment in which moist-heat sterilization is performed for preservation of food products or the like. Usually, a gas barrier laminate in which a food product or the like is packaged is subjected to moist-heat sterilization treatment for 10 to 120 minutes at 60 to 100° C. and atmospheric pressure, although it depends on the contents. The boiling treatment, which is usually performed using a hot water bath, includes a batch type treatment in which the gas barrier laminate is immersed in a hot water bath at a predetermined temperature and removed after a predetermined time, and a continuous type treatment in which the gas barrier laminate is passed through a tunnel in a hot water bath for sterilization.

The gas barrier laminates 10C and 10D are provided with the inorganic vapor deposition layer 3 and the coating layer 6, and thus have good gas barrier properties and an effect of preventing retort odor. Under conditions of a temperature of 30° C. and a relative humidity of 70% RH, the gas barrier laminates 10C and 10D preferably have an oxygen permeability of 30 cc/m$^2$·day·MPa or less, more preferably 15 cc/m$^2$·day·MPa or less, and particularly preferably 1.5 cc/m$^2$·day·MPa or less. A lower oxygen permeability is more preferable, and the lower limit is not particularly limited, but the oxygen permeability is usually 0.01 cc/m$^2$·day·MPa or more.

Under conditions of a temperature of 40° C. and a relative humidity of 90% RH, the gas barrier laminates 10C and 10D usually have a water vapor permeability of 5 g/m$^2$·day or less, preferably 5 g/m$^2$·day or less, and particularly preferably 1 g/m$^2$·day or less. A lower water vapor permeability is more preferable, and the lower limit is not particularly limited, but the water vapor permeability is usually 0.01 g/m$^2$·day or more.

The effect of preventing retort odor can be evaluated by ultraviolet absorbance. The reason is as follows. Specifically, in the case of the contents containing a large amount of sulfur-containing amino acid component, hydrogen sulfide generated during retort treatment is permeated in the gas barrier layer, and the hydrogen sulfide reacts with zinc oxide to generate zinc sulfide. In the coating layer, zinc ions of the zinc oxide normally form ionic crosslinking with a carboxy group to exhibit barrier properties, However, when zinc sulfide is generated, the zinc oxide becomes insufficient accordingly, leading to deterioration of the barrier properties. Therefore, in order to prevent deterioration of the gas barrier layer, the amount of zinc oxide is increased, resulting in an increase in ultraviolet absorbance of the coating layer.

Thus, the coating layer having a higher ultraviolet absorbance can achieve better gas barrier properties and prevention of retort odor. However, the coating layer having a high ultraviolet absorbance causes reduction in transparency and deterioration of appearance as well as an increase in manufacturing cost. Thus, an excessively high ultraviolet absorbance is not preferable. According to the findings of the inventors, the coating layer having an ultraviolet absorbance in the range of 0.3 or more and 0.7 or less have sufficient barrier properties.

In the gas barrier laminates 10C and 10D, the ratio of the thickness of the second coating layer 6b to the thickness of the first coating layer 6a may be in the range of 1.0 or more and 4.0 or less, and preferably in the range of 1.1 or more and 3.0 or less. The second coating layer 6b may satisfy at least one of the following conditions 1 to 3, or may satisfy two or three of the following conditions 1 to 3:

(condition 1) a haze of the second coating layer 6b is 8% or less;

(condition 2) a surface roughness Ra of the second coating layer 6b is ½ or less of the thickness of the second coating layer 6b; and (condition 3) the number of concave portions having a diameter of 1.5 μm or more per unit area on a surface of the second coating layer 6b opposite to the first coating layer 6a is 2/0.01 mm$^2$ or less.

EXAMPLES

The present invention will be described in more detail using the following examples, but the present invention is not limited to the examples.

Examples 1 to 3 and Comparative Examples 1 to 3

Methods of preparing an anchor coating liquid and coating solutions used in Examples and Comparative Examples will be described below.

<Preparation of Anchor Coating Liquid>

In a dilution solvent (ethyl acetate), 1 part by mass of γ-isocyanatopropyltrimethoxysilane and 5 parts by mass of acrylic polyol were mixed and stirred to obtain a solution. Subsequently, tolylene diisocyanate (TDI) was added to the solution so that the amount of isocyanate groups was equal to the amount of hydroxyl groups of the acrylic polyol. Then, the solution was diluted with ethyl acetate to a concentration of 2 mass % to obtain an anchor coating liquid.

<Preparation of Coating Solution A>

For the preparation, 20 g of polyacrylic acid aqueous solution ("Aron A-10H" manufactured by Toagosei Co., Ltd., 25-mass % solid concentration) having a number average molecular weight of 200,000 was dissolved in 58.9 g of distilled water. To this mixture, 0.44 g of aminopropyltrimethoxysilane (manufactured by Sigma-Aldrich Japan Co. LLC.) was added and uniformly stirred. Thus, a coating solution A was obtained.

<Preparation of Coating Solution B>

For the preparation, 100 g of aqueous dispersion of zinc oxide fine particles ("ZE143" manufactured by Sumitomo Osaka Cement Co., Ltd.) was mixed with 1 g of curing agent ("Liofol HAERTER UR 5889-21" manufactured by Henkel) to obtain a coating solution B.

Example 1

(Production of Gas Barrier Laminate)

The anchor coating liquid was applied onto a corona-treated surface of a biaxially stretched polyethylene terephthalate film ("Lumirror (registered trademark) P60" manufactured by Toray Industries, Inc., 12-μm thickness, corona-treated inner portion) as a resin substrate by using a bar coater so as to have a thickness after drying of 0.2 μm, and dried at 150° C. for 1 minute, thereby forming a primer layer. Then, by using a vacuum vapor deposition device based on an electron beam heating method, metal aluminum was evaporated while oxygen gas was introduced thereto to deposit aluminum oxide on the primer layer, thereby forming an inorganic vapor deposition layer with a thickness of 20 nm.

Next, the coating solution A was applied onto the inorganic vapor deposition layer by using the bar coater so as to have a thickness after drying of 0.15 μm, Then, the coating solution A was dried at 80° C. for 5 minutes, aged at 50° C. for 3 days, and heat treated at 200° C. for 5 minutes, thereby forming a first coating layer. Subsequently, the coating solution B was applied onto the first coating layer by gravure printing using a cylinder (plate cylinder) having a ceramic-coated surface so as to have a thickness after drying of 0.25 μm, and then dried at 90° C. for 2 minutes, thereby forming a second coating layer. Thus, a gas barrier laminate having a laminated structure including the PET film (12 μm), the primer layer (0.2 μm), the inorganic vapor deposition layer (20 nm), the first coating layer (0.15 μm), and the second coating layer (0.25 μm) was obtained.

(Production of Sheet (Packaging Film))

An unstretched polypropylene film (CPP film, "Torayfan NO ZK93KM" manufactured by Toray Advanced Film Co., Ltd., 60-μm thickness) as a sealant layer was laminated by dry lamination on the second coating layer of the gas barrier laminate by using a two-component adhesive ("A620/A65" manufactured by Mitsui Chemicals & SKC Polyurethanes Inc.). Thus, a transparent packaging film having a laminated structure including the gas barrier laminate, the bonding layer (3 μm), and the sealant layer (60 μm) was obtained.

Example 2

A gas barrier laminate and a package were obtained in the same manner as in Example 1 except that the thickness after drying of the second coating layer was changed to 0.15 μm.

Example 3

A gas barrier laminate and a package were obtained in the same manner as in Example 1 except that the thickness after drying of the second coating layer was changed to 0.45 μm.

Comparative Example 1

A gas barrier laminate and a packaging film were produced in the same manner as in Example 1 except that the coating solution B was applied onto the first coating layer by gravure printing using a cylinder having a Cr-plated surface so as to have a thickness (thickness of the second coating layer) after drying of 1.2 μm.

Comparative Example 2

A gas barrier laminate and a packaging film were produced in the same manner as in Comparative Example 1 except that the thickness after drying of the second coating layer was changed to 0.07 μm.

Comparative Example 3

An aluminum foil having a thickness of 9 μm was laminated by dry lamination on a biaxially stretched polyethylene terephthalate film (PET: "Lumirror P60" manufactured by Toray Industries, Inc., 12-μm thickness), thereby obtaining a gas barrier laminate (Al foil laminate). In the same manner as in Example 1 except that the gas barrier laminate was used, a packaging film having a laminated structure including the PET (12 μm), the aluminum foil (9 μm), the bonding layer (3 μm), and the sealant layer (60 μm) was produced.

[Evaluation Method]

<Measurement of Haze>

The haze of the second coating layer of the gas barrier laminates of the examples was measured. Specifically, the haze of the second coating layer was measured by using a haze meter (NDH2000 manufactured by Nippon Denshoku Industries Co., Ltd.). Table 1 shows the results.

<Measurement of Surface Roughness Ra>

The surface roughness Ra of the second coating layer of the gas barrier laminates of the examples was measured by using a scanning probe microscope (SPM). Specifically, the surface roughness Ra of the second coating layer was measured with a measurement area of 20 μm×20 μm and a measurement frequency of 1 Hz by using a device MFP-3D manufactured by Asylum Research. Table 1 shows the results.

<Measurement of the Number of Concave Portions>

Figure 12:
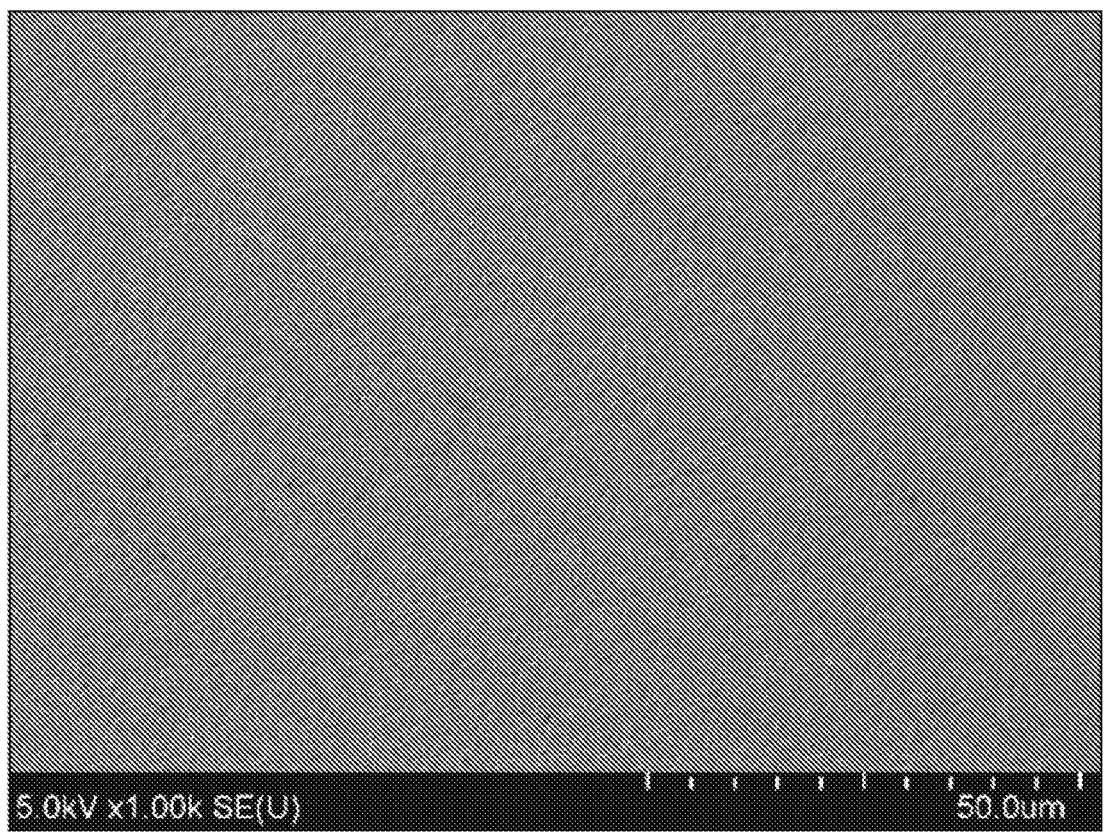
FIG. 12 is an SEM image of a surface of a second coating layer of a gas barrier laminate obtained in Example 1.
Figure 13:
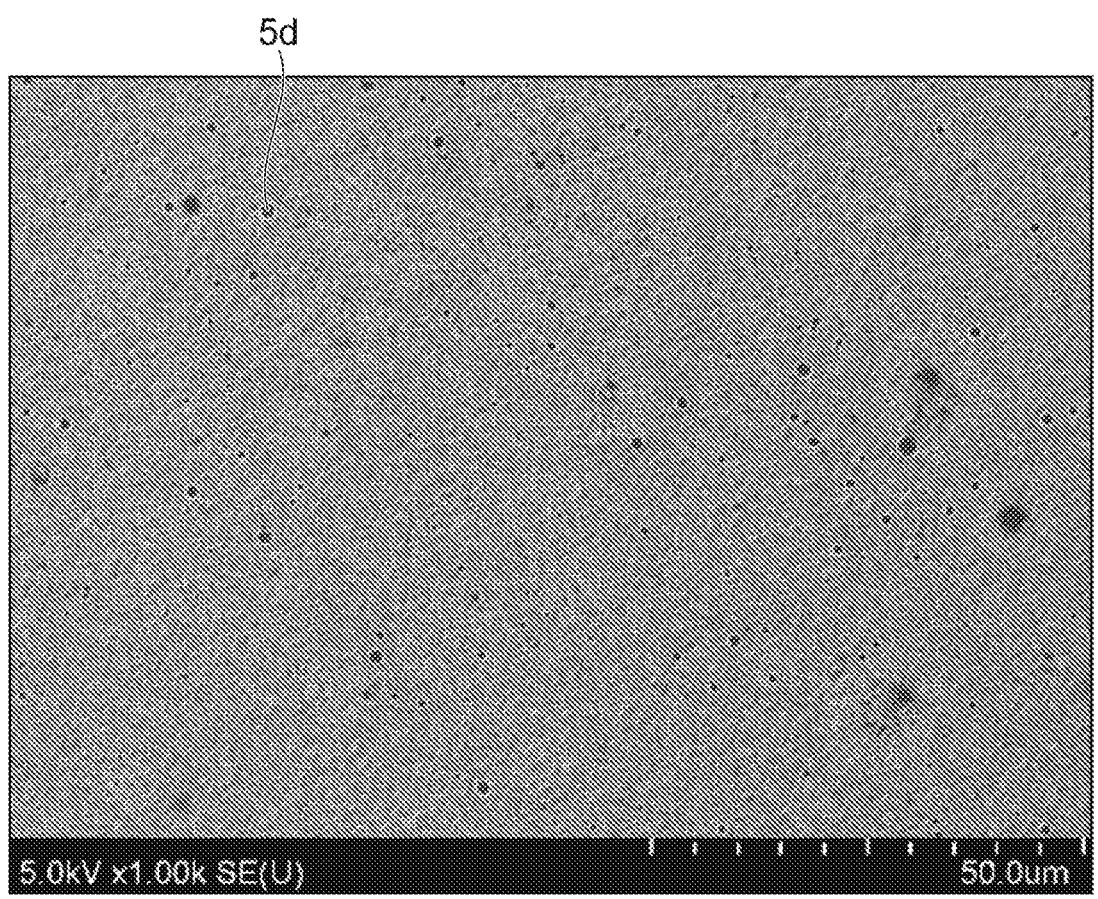
FIG. 13 is an SEM image of a surface of a second coating layer of a gas barrier laminate obtained in Comparative Example 1.

A surface of the second coating layer of the gas barrier laminates obtained in Example 1 and Comparative Examples 1 and 2 was observed by using a scanning electron microscope (SEM), and an enlarged image of a visual field of 0.1 mm×0.1 mm was captured. Then, the number of concave portions having a diameter of 1.5 μm or more shown in the image was counted. Thus, the number of concave portions having a diameter of 1.5 μm or more per unit area (unit: the number of concave portions/0.01 mm$^2$) was obtained. Table 1 shows the results. FIGS. 12 and 13 show enlarged images of the surface of the second coating layer of the gas barrier laminates obtained in Example 1 and Comparative Example 1, respectively.

<Evaluation of Retort Odor>

The packaging films obtained in Examples and Comparative Examples were each cut into an A4 size and folded in half at the center of the long side so that the sealant layer was arranged on the inner side, and then two sides of the film were heat sealed, thereby producing a pouch (packaging material) having an opening. The heat sealing was performed under conditions of 190° C., 0.3 MPa, and 2 sec by using a tabletop vacuum sealer V-301 (manufactured by Fuji Impulse Co., Ltd.). The pouches were filled with 150 mL of cysteine solution of 0.6 mass %. Subsequently, an open side of the pouches was heat sealed to obtain sealed packages.

The "cysteine solution of 0.6 mass %" filled in the present example had a higher concentration than a cysteine solution generated from the actual contents assumed to be filled. That is, in the present example, retort odor prevention properties and oxygen barrier properties were confirmed under more severe conditions than actual conditions.

The obtained packages were subjected to retort treatment at 125° C. for 30 minutes by using a hot-water storage type retort oven. After the retort treatment, gas in the packages was collected, and the amount (unit: mass ppm) of hydrogen sulfide in the gas was measured by using a Kitagawa gas detector (gas sampler AP-20 and hydrogen sulfide detector tube manufactured by Komyo Rikagaku Kogyo K.K.). A smaller amount of hydrogen sulfide indicates that more hydrogen sulfide was adsorbed on the packaging film, preventing retort odor. Table 1 shows the results.

<Measurement of Oxygen Permeability>

In the same manner as the evaluation of retort odor, sealed packaged were produced and the packages were subjected to retort treatment. In the packages obtained after the retort treatment, oxygen permeability was measured under measurement conditions of a temperature of 30° C. and a relative humidity of 70% by using an oxygen permeability measuring device ("OXTRAN2/20" manufactured by Modern Control, Inc.). Table 1 shows the results.

TABLE 1

|  | Example 1 | Example 2 | Example 3 | Comparative Example 1 | Comparative Example 2 | Comparative Example 3 |
|---|---|---|---|---|---|---|
| Thickness ratio (second coating layer/first coating layer) | 1.67 | 1.00 | 3.00 | 8.00 | 0.47 | — |
| Thickness (μm) of second coating layer | 0.25 | 0.15 | 0.45 | 1.2 | 0.07 | — |
| Haze (%) | 3.5 | 3.0 | 7.7 | 10.0 | 3.0 | — |
| Surface roughness Ra (nm) | 18 | 17 | 70 | 200 | 100 | — |
| Number of concave portions (number/0.01 mm$^2$) | 1 | — | — | 100 | 1 | — |
| Hydrogen sulfide amount (mass ppm) | 80 | 90 | 75 | 80 | 190 | 300 |
| Oxygen permeability (cc/m$^2$ · day · atm) | 0.1 | 0.1 | 0.1 | 50 | 120 | >0.1 |

Examples 4 to 7 and Comparative Examples 4 to 7

<Preparation of Composition for Forming Adhesive Layer>

Acrylic polyol and triyl-diisocyanate were mixed so that the amount of NCO groups was equal to the amount of OH groups of the acrylic polyol, and then diluted with ethyl acetate so that the total solid content was 5 w %. To this mixture, β-(3,4-epoxycyclohexyl)trimethoxysilane of 5 w % relative to the total solid content was added and mixed, thereby obtaining a composition (coating solution) for forming an adhesive layer.

<Formation of Modification Treatment Layer 1R>

Figure 8:
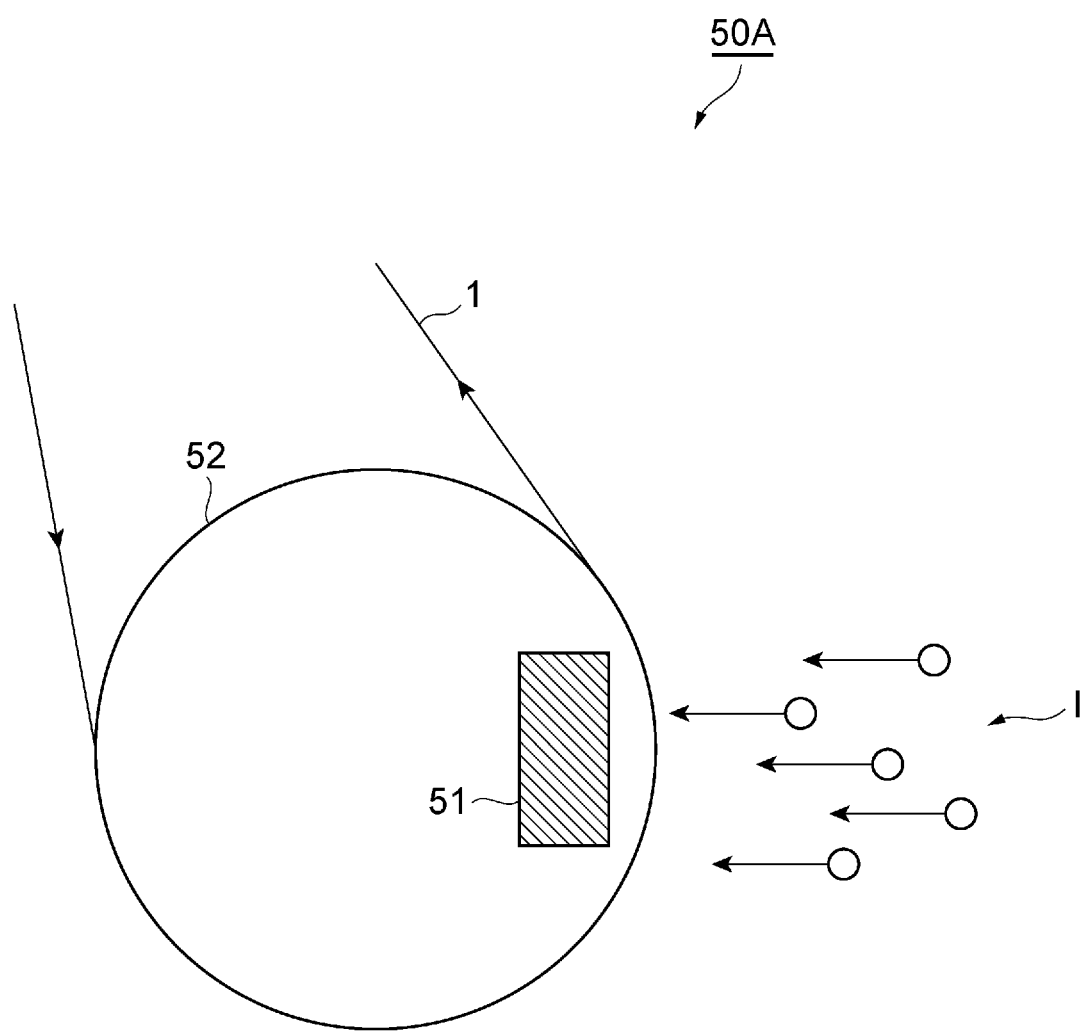
FIG. 8 is a schematic diagram showing an example of a mode in which a film surface is subjected to RIE treatment by using a planar plasma treatment device.

As a plasma treatment device, a planar plasma treatment device having the same configuration as the configuration shown in FIG. 8 was used to form a modification treatment layer 1R by RIE treatment. In the RIE treatment, as plasma generation gas, a mixed gas of argon and oxygen was introduced into an electrode unit, and by using a high-frequency power supply at a frequency of 13.5 MHz, a voltage was applied to the electrode unit to generate plasma. At this time, the applied electric power was 150 W, the self-bias value was 600 V, and the plasma density Epd value was 500 W·sec/m$^2$.

<Preparation of Composition for Forming Coating Layer 6>

Coating solution (a): A coating solution (a) was prepared in the following manner.

Specifically, 20 g of PAA aqueous solution (Aron A-10H manufactured by Toagosei, 25-mass % solid concentration) having a number average molecular weight of 200,000 was dissolved in 58.9 g of distilled water. Then, to this mixture, 0.44 g of aminopropyltrimethoxysilane (APTMS: manufactured by Aldrich) was added and stirred to form a uniform solution, thereby obtaining the coating solution (a).

Coating solution (b): A coating solution (b) was prepared in the following manner.

Specifically, 100 g of aqueous dispersion of zinc oxide fine particles ("ZE143" manufactured by Sumitomo Osaka Cement) was mixed with 1 g of curing agent Liofol HAERTER UR 5889-21 (manufactured by Henkel), thereby obtaining the coating solution (b).

Example 4

An adhesive layer 2A was formed on a corona-treated surface of a biaxially stretched polyethylene terephthalate film (PET: Lumirror (registered trademark) P60 manufactured by Toray, 12-μm thickness) by gravure coating using a gravure coater so as to have a thickness of 0.1 μm. Then, by using a vacuum vapor deposition device based on an electron beam heating method, metal aluminum was evaporated while oxygen gas was introduced thereto to deposit aluminum oxide on the adhesive layer 2A, thereby forming an inorganic vapor deposition layer 3 with a thickness of 20 nm. In order to form a coating layer 6, the coating solution (a) was applied onto the inorganic vapor deposition layer 3 by using a bar coater so as to have a thickness after drying of 1 μm, and then dried at 80° C. for 5 minutes, thereby forming a first coating layer 6a. The coating solution (b) was applied onto the first coating layer 6a by using the bar coater so as to have a thickness after drying of 1 μm and an ultraviolet absorbance target value of 0.30. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. The actual ultraviolet absorbance was measured by the following measuring method, and is shown in Table 2. The ultraviolet absorbance was measured in the same manner in the other Examples and Comparative Examples described below. Thus, a gas barrier laminate having a configuration including the PET (12 μm), the adhesive layer 2A (0.1 μm), the inorganic vapor deposition layer 3 (20 nm), and the coating layer 6: the first coating layer 6a (1 μm) and the second coating layer 6b (1 μm) was obtained. The values in parentheses indicate the thickness of the layers, and the same applies to the following examples.

Next, an unstretched polypropylene film (CPP: CPP, Torayfan NO ZK207 manufactured by Toray Advanced Film Co., Ltd., 60-μm thickness) was laminated by dry lamination on the layer of the gas barrier laminate by using a two-component adhesive (A525/A52 manufactured by Mitsui Chemicals) to obtain a laminate film having a configuration including the gas barrier layer, the adhesive layer, and the CPP (60 μm).

Then, the laminate film was cut into a size of 10 cm×10 cm. Two cut film pieces were overlapped with each other so that the CPP layers were arranged on the inner side, and then heat sealed to form a packaging material. The packaging material was filled with 150 ml of L-cysteine solution at a concentration of 0.3%/L (L-cysteine manufactured by Kanto Chemical Co., Inc. was used) as a material containing sulfur-containing amino acid, and then hermetically sealed also by heat sealing. After that, the packaging material was subjected to retort treatment for 30 minutes at 0.18 MPa and 121° C. by using a hot-water storage type retort oven.

Example 5

A first coating layer 6a was formed in the same manner as in Example 4. Then, the coating solution (b) was applied onto the first coating layer 6a by using a bar coater so as to have a thickness after drying of 1 μm and an ultraviolet absorbance target value of 0.60. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the adhesive layer 2A (0.1 μm), the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 4, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

Comparative Example 4

A first coating layer 6a was formed in the same manner as in Example 4. Then, the coating solution (b) was applied onto the first coating layer 6a by using a bar coater so as to have a thickness after drying of 1 μm and an ultraviolet absorbance target value of 0.10. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the adhesive layer 2A (0.1 μm), the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 4, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

Comparative Example 5

A first coating layer 6a was formed in the same manner as in Example 4. Then, the coating solution (b) was applied onto the first coating layer 6a by using a bar coater so as to have a thickness after drying of 1 μm and an ultraviolet absorbance target value of 0.20. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the adhesive layer 2A (0.1 μm), the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 4, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

Example 6

A corona-treated surface of a biaxially stretched polyethylene terephthalate film (PET: Lumirror (registered trademark) P60 manufactured by Toray, 12-μm thickness) was subjected to RIE treatment to form a modification treatment layer 1R. Then, by using a vacuum vapor deposition device based on an electron beam heating method, metal aluminum was evaporated while oxygen gas was introduced thereto to deposit aluminum oxide on the RIE-treated surface, thereby forming an inorganic vapor deposition layer 3 with a thickness of 20 nm. In order to form a coating layer 6, the coating solution (a) was applied onto the inorganic vapor deposition layer 3 by using a bar coater so as to have a thickness after drying of 1 μm, and then dried at 80° C. for 5 minutes, thereby forming a first coating layer 6a. The coating solution (b) was applied onto the first coating layer 6a by using the bar coater so as to have a thickness after drying of 1 μm and an ultraviolet absorbance target value of 0.30. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the modification treatment layer 1R, the inorganic vapor deposition layer 3 (20 nm), and the coating layer 6: the first coating layer 6a (1 μm) and the second coating layer 6b (1 μm) was obtained.

Next, an unstretched polypropylene film (CPP: CPP, Torayfan NO ZK207 manufactured by Toray Advanced Film Co., Ltd., 60-μm thickness) was laminated by dry lamination on the layer of the gas barrier laminate by using a two-component adhesive (A525/A52 manufactured by Mitsui Chemicals) to obtain a laminate film having a configuration including the gas barrier layer, the adhesive layer, and the CPP (60 μm).

Then, the laminate film was cut into a size of 10 cm×10 cm. Two cut film pieces were overlapped with each other so that the CPP layers were arranged on the inner side, and then heat sealed to form a packaging material. The packaging material was filled with 150 ml of L-cysteine solution at a concentration of 0.3%/L (L-cysteine manufactured by Kanto Chemical Co., Inc. was used) as a material containing sulfur-containing amino acid, and then hermetically sealed also by heat sealing. After that, the packaging material was subjected to retort treatment for 30 minutes at 0.18 MPa and 121° C. by using a hot-water storage type retort oven.

Example 7

A first coating layer 6a was formed in the same manner as in Example 6. Then, the coating solution (b) was applied onto the first coating layer 6a by using a bar coater so as to have a thickness after drying of 1 μm and an ultraviolet absorbance target value of 0.60. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the modification treatment layer 1R, the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 6, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

Comparative Example 6

A first coating layer 6a was formed in the same manner as in Example 6. Then, the coating solution (b) was applied onto the first coating layer 6a by using a bar coater so as to have a thickness after drying of 1 μm and an ultraviolet absorbance target value of 0.10. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the modification treatment layer 1R, the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 6, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

Comparative Example 7

A first coating layer 6a was formed in the same manner as in Example 6. Then, the coating solution (b) was applied onto the first coating layer 6a by using a bar coater so as to have a thickness after drying of 1 μm and an ultraviolet absorbance target value of 0.20. The ultraviolet absorbance was a value obtained by subtracting an absorbance at a wavelength of 500 nm from an absorbance at a wavelength of 350 nm measured by absorptiometry. Subsequently, the coating solution (b) was dried at 90° C. for 2 minutes and then aged at 50° C. for 3 days, thereby forming a second coating layer 6b. Thus, a gas barrier laminate having a configuration including the PET (12 μm), the modification treatment layer 1R, the inorganic vapor deposition layer 3 (20 nm), and the coating layer 6: the first coating layer 6a (1 μm) and the second coating layer 6b (1 μm) was obtained.

Then, a laminate film was obtained in the same manner as in Example 6, and the laminate film was heat sealed to form a packaging material. The packaging material was filled with 150 ml of L-cysteine solution at a concentration of 0.3%/L (L-cysteine manufactured by Kanto Chemical Co., Inc. was used) and then hermetically sealed also by heat sealing. After that, the packaging material was subjected to retort treatment for 30 minutes at 0.18 MPa and 121° C. by using a hot-water storage type retort oven.

<Evaluation and Method>

The gas barrier laminates and the packaging materials subjected to the retort treatment obtained in Examples 4 to 7 and Comparative Examples 4 to 7 were subjected to the following measurement and evaluation (1) to (4).

(1) Evaluation of ultraviolet absorbance: Ultraviolet absorbance of the gas barrier laminates was evaluated.

A spectrophotometer (Shimadzu spectrophotometer UV-2450 manufactured by Shimadzu Corporation) was used. For the measurement, an integrating sphere attachment device was used. The measurement range was set to a wavelength in the range of 300 to 550 nm. The ultraviolet absorbance was a value obtained by subtracting a measurement value of 0.02 from the value obtained by subtracting an absorbance at a wavelength of 500 nm from an absorbance at a wavelength of 350 nm. The measurement value was obtained in the same manner in a state where the gas barrier laminate included no layer containing a polyvalent metal compound (the adhesive layer 2A and the inorganic vapor deposition layer 3 were laminated on the biaxially stretched polyethylene terephthalate film or the modification treatment layer 1R and the inorganic vapor deposition layer 3 were laminated on the biaxially stretched polyethylene terephthalate film).

(2) Evaluation of gas barrier properties: Oxygen permeability and water vapor permeability of the gas barrier laminates and the packaging materials subjected to the retort treatment were evaluated in the following manner.

With regard to the packaging materials subjected to the retort treatment, after the retort treatment, the L-cysteine solution at a concentration of 0.3%/L filled in the packaging materials was removed, and the gas barrier laminates dried overnight were subjected to the measurement.

[Method of Measuring Oxygen Permeability]

The oxygen permeability was measured under conditions of a temperature of 30° C. and a relative humidity of 70% by using an oxygen permeability measuring device (OX-TRAN2/20 manufactured by Modern Control Inc.). The measuring method was in accordance with JIS K-7126, method B (equal-pressure method), and the measurement values were expressed in units of [cc/m$^2$·day·MPa].

[Method of Measuring Water Vapor Permeability]

The water vapor permeability was measured under conditions of a temperature of 40° C. and a relative humidity of 90% by using a water vapor permeability measuring device (PERMATRAN3/31 manufactured by Modern Control Inc.). The measuring method was in accordance with JIS K-7129, and the measurement values were expressed in units of [g/m$^2$·day].

(3) Evaluation of adhesion: Adhesion of the packaging materials subjected to the retort treatment was evaluated.

After the retort treatment, the L-cysteine solution at a concentration of 0.3%/L filled in the packaging materials was removed, and the gas barrier laminates dried overnight were subjected to the evaluation of adhesion in accordance with JIS K 6854-3 (T-peeling). In Table 2, "substrate breakage" indicates the case where the packaging material was broken while the laminate and the substrate were not separated and adhered to each other.

(4) Retort odor (as alternative evaluation, the concentration of hydrogen sulfide was measured): Retort odor of the packaging materials subjected to the retort treatment was evaluated.

After the retort treatment, the packaging materials were opened, and the concentration of hydrogen sulfide in the packaging materials was quantified by using a Kitagawa gas detector (gas sampler "AP-20B" and hydrogen sulfide detector tube manufactured by Komyo Rikagaku Kogyo K.K.).

Table 2 shows the results measured by the methods described above.

treatment, the packaging materials had high oxygen permeability and high water vapor permeability, leading to deterioration of the gas barrier properties. Furthermore, a high concentration of hydrogen sulfide indicates that the packaging materials failed to prevent unpleasant retort odor due to the retort treatment. In Comparative Examples 4 and 6, the adhesion was insufficient. Therefore, the laminates of Comparative Examples 4 to 7 were unsuitable as packaging materials for retort treatment.

The results showed that in an embodiment, the present disclosure can provide a gas barrier laminate and a packaging material that can achieve good adhesion, reduction in concentration of hydrogen sulfide, high oxygen barrier properties, and high water vapor barrier properties even when subjected to heat sterilization treatment while the contents contain a large amount of sulfur-containing amino acid such as meat, fish, egg, and bean products.

INDUSTRIAL APPLICABILITY

An aspect of the present disclosure can provide a gas barrier laminate capable of achieving both oxygen barrier

TABLE 2

|  |  | Example 4 | Example 5 | Comparative Example 4 | Comparative Example 5 | Example 6 | Example 7 | Comparative Example 6 | Comparative Example 7 |
|---|---|---|---|---|---|---|---|---|---|
| Adhesive layer | | Present | Present | Present | Present | Absent | Absent | Absent | Absent |
| RIE treatment | | Absent | Absent | Absent | Absent | Present | Present | Present | Present |
| Ultraviolet absorbance | | 0.33 | 0.58 | 0.11 | 0.22 | 0.33 | 0.65 | 0.11 | 0.22 |
| Gas barrier laminate | Oxygen permeability (cc/m² · day · MPa) | 1.1 | 0.8 | 1.2 | 1.0 | 1.1 | 0.8 | 1.2 | 1.0 |
| | Water vapor permeability (g/m² · day) | 2.5 | 1.5 | 4.1 | 3.5 | 0.3 | 0.5 | 0.3 | 0.4 |
| Packaging material subjected to retort treatment | Oxygen permeability (cc/m² · day · MPa) | 1.4 | 0.9 | 1230 | 400 | 1.2 | 0.9 | 1230 | 400 |
| | Water vapor permeability (g/m² · day) | 3.3 | 1.5 | >10 | 9.0 | 1.7 | 1.5 | >10 | 9.0 |
| | Adhesion (N/15 mm) | Substrate breakage | Substrate breakage | 1.5 | Substrate breakage | Substrate breakage | Substrate breakage | 1.5 | Substrate breakage |
| | Hydrogen sulfide concentration (ppm) | 10 | 20 | 150 | 90 | 15 | 10 | 150 | 90 |
| Overall evaluation | | Good | Good | Unsuitable | Unsuitable | Good | Good | Unsuitable | Unsuitable |

<Evaluation Results>

Table 2 shows that in Example 4, the packaging material subjected to the retort treatment showed good results such as sufficient adhesion, a low concentration of hydrogen sulfide in the packaging material, an oxygen permeability at a level of 1 cc/m²·day·MPa, and a water vapor permeability at a level of 3 g/m²·day level. Table 2 shows that also in Examples 5 to 7, the packaging materials subjected to the retort treatment showed good results such as sufficient adhesion, a low concentration of hydrogen sulfide, and a low oxygen permeability and a low water vapor permeability.

On the other hand, in Comparative Examples 4 to 7, in the state of the gas barrier laminates, both the oxygen permeability and the water vapor permeability were at the same level as in Examples 4 to 7. However, when the packaging materials were filled with the contents containing a large amount of sulfur-containing amino acid (in this evaluation, as alternative evaluation, the L-cysteine solution at a concentration of 0.3%/L was used) and subjected to the retort properties and prevention of retort odor, and a packaging material including the gas barrier laminate.

REFERENCE SIGNS LIST

1 . . . Resin substrate; 1A . . . Plastic substrate (film substrate); 1R . . . Modification treatment layer; 2 . . . Primer layer; 2A . . . Adhesive layer; 3 . . . Inorganic vapor deposition layer; 5a, 6a . . . First coating layer; 5b, 6b . . . Second coating layer; 5d . . . Concave portion; 6 . . . Coating layer; 10A, 10B, 10C, 10D . . . Gas barrier laminate; 20 . . . Sheet; 21 . . . Bonding layer; 22 . . . Sealant layer; 30 . . . Packaging material; 30a . . . Outer surface; 30b . . . Inner surface; 30c . . . Body portion; 30d . . . Sealed portion; 40 . . . Package; 42 . . . Contents; 50A . . . Planar plasma treatment device; 50B . . . Hollow anode plasma treatment device; 51 . . . Electrode; 52 . . . Treatment roll; 55 . . . Gas introduction nozzle; 56 . . . Matching box; 57 . . . Shielding plate; I . . . Ion; L . . . Liquid; S . . . Solid.

What is claimed is:

1. A gas barrier laminate, comprising:
   a resin substrate;
   a first coating layer containing a carboxylic acid polymer;
   a second coating layer containing a polyvalent metal compound and a resin;
   an inorganic vapor deposition layer that contains an inorganic oxide and is between the resin substrate and the first coating layer; and
   a primer layer that contains a urethane compound and is between the resin substrate and the inorganic vapor deposition layer;
   wherein:
   the resin substrate, the first coating layer, and the second coating layer are laminated in this order;
   a ratio of a thickness of the second coating layer to a thickness of the first coating layer is in the range of 1.0 or more and 4.0 or less; and
   the second coating layer satisfies each of the following conditions 1 to 3:
      (condition 1) a haze of the second coating layer is 8% or less;
      (condition 2) a surface roughness Ra of the second coating layer is ½ or less of the thickness of the second coating layer; and
      (condition 3) the number of concave portions having (i) a depth 50% or more of the thickness of the second coating layer and (ii) a diameter of 1.5 μm or more per unit area on a surface of the second coating layer opposite to the first coating layer is $2/0.01\ mm^2$ or less;
   wherein the resin of the second coating layer is selected from the group consisting of an alkyd resin, a melamine resin, an acrylic resin, a urethane resin, a phenol resin, an amino resin, a polyester resin, a fluororesin, an epoxy resin, and an isocyanate resin and the resin of the second coating layer is the only resin in the second coating layer; and
   wherein the first coating layer is in direct contact with the inorganic vapor deposition layer.

2. The gas barrier laminate of claim 1, wherein the thickness of the second coating layer is in the range of 0.10 μm or more and 0.50 μm or less.

3. The gas barrier laminate of claim 1, wherein:
   the polyvalent metal compound is zinc oxide; and
   a content of the zinc oxide is in the range of 65 mass % or more and 85 mass % or less relative to a mass of the second coating layer.

4. The gas barrier laminate of claim 1, wherein the first coating layer is in direct contact with the second coating layer.

5. The gas barrier laminate of claim 1, wherein the gas barrier laminate is for use as a packaging material to be subjected to retort treatment or boiling treatment.

6. A packaging material comprising the gas barrier laminate of claim 1.

7. The gas barrier laminate of claim 1, wherein the carboxylic acid polymer in the first coating layer is unneutralized.

* * * * *